(12) United States Patent
Kishimoto et al.

(10) Patent No.: US 11,500,506 B2
(45) Date of Patent: Nov. 15, 2022

(54) DISPLAY DEVICE INCLUDING A DIGITIZER WITH REDUCED WIRING VISIBILITY

(71) Applicant: SAMSUNG DISPLAY CO., LTD., Yongin-si (KR)

(72) Inventors: Hirotsugu Kishimoto, Hwaseong-si (KR); Seok Won Jang, Seoul (KR); Yong Chan Jeon, Cheonan-si (KR); Hyun Been Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/171,063

(22) Filed: Feb. 9, 2021

(65) Prior Publication Data
US 2021/0357048 A1 Nov. 18, 2021

(30) Foreign Application Priority Data
May 14, 2020 (KR) .................. 10-2020-0057891

(51) Int. Cl.
*G06F 3/046* (2006.01)
*H01L 27/32* (2006.01)
*H01L 51/00* (2006.01)

(52) U.S. Cl.
CPC ............ *G06F 3/046* (2013.01); *H01L 27/323* (2013.01); *H01L 27/3244* (2013.01); *H01L 51/0097* (2013.01); *G06F 2203/04102* (2013.01); *H01L 2251/5338* (2013.01)

(58) Field of Classification Search
CPC .......... G06F 2203/04102; G06F 3/046; H01L 2251/5338; H01L 27/323; H01L 27/3244; H01L 51/0097
See application file for complete search history.

(56) References Cited

U.S. PATENT DOCUMENTS

| 11,086,159 B2* | 8/2021 | Kim ................. G06F 3/041 |
| 2015/0355798 A1* | 12/2015 | Kinehara ............ G06F 3/0346 715/776 |

FOREIGN PATENT DOCUMENTS

| KR | 10-2016-0109964 | 9/2016 |
| KR | 10-2021-0052699 | 5/2021 |

* cited by examiner

*Primary Examiner* — Afroza Chowdhury
(74) *Attorney, Agent, or Firm* — F. Chau & Associates, LLC

(57) ABSTRACT

A display device including: a display panel; and a digitizer overlapped by the display panel, wherein the digitizer includes a base layer, a folding area, first circuit patterns disposed on a first surface of the base layer and extending in a first direction, a plurality of first dummy patterns disposed in regions defined by the first circuit patterns, second circuit patterns disposed on a second surface of the base layer and extending in a second direction that intersects the first direction, and a plurality of second dummy patterns disposed in regions defined by the second circuit patterns, the second dummy patterns include a plurality of first lower dummy patterns, which do not overlap the folding area, and a plurality of second lower dummy patterns, which overlap the folding area.

25 Claims, 27 Drawing Sheets

DISPLAY DEVICE INCLUDING A DIGITIZER WITH REDUCED WIRING VISIBILITY

DISPLAY DEVICE

This application claims priority under 35 U.S.C. § 119 to Korean Patent Application No. 10-2020-0057891 filed on May 14, 2020, in the Korean Intellectual Property Office, the disclosure of which is incorporated by reference herein in its entirety.

1. Technical Field

The present invention relates to a display device.

2. Description of the Related Art

Electronic devices that provide images to users, such as a smartphone, a digital camera, a notebook computer, a navigation device, and a smart television (TV), include display devices for displaying an image. The display device may include a liquid crystal display, a light-emitting diode display, a quantum dot display, etc.

Electronic devices may employ flexible display devices that are curved, bendable, or rollable.

Electronic devices may support not only touch input made with parts of the bodies of users, but also touch input made by electronic pens (e.g., a stylus).

A stylus-based touch input method may include an electromagnetic resonance method and an active electrostatic method. The electromagnetic resonance method employs a digitizer included in an electronic device to sense an induced electromagnetic force. For example, at least one conductive circuit capable of detecting an external electromagnetic force may be patterned on the digitizer.

SUMMARY

According to an exemplary embodiment of the present invention, there is provided a display device including: a display panel; and a digitizer overlapped by the display panel, wherein the digitizer includes a base layer, a folding area, first circuit patterns disposed on a first surface of the base layer and extending in a first direction, a plurality of first dummy patterns disposed in regions defined by the first circuit patterns, second circuit patterns disposed on a second surface of the base layer and extending in a second direction that intersects the first direction, and a plurality of second dummy patterns disposed in regions defined by the second circuit patterns, the second dummy patterns include a plurality of first lower dummy patterns, which do not overlap the folding area, and a plurality of second lower dummy patterns, which overlap the folding area.

An area occupied by the second lower dummy patterns may be smaller than an area occupied by the first lower dummy patterns.

The number of second lower dummy patterns may be greater than the number of first lower dummy patterns.

At least one of the second lower dummy patterns may be divided into multiple parts.

The number of second lower dummy patterns may be smaller than the number of first lower dummy patterns.

At least one of the second lower dummy patterns may be unbroken.

The first dummy patterns may include a plurality of first upper dummy patterns, which do not overlap the folding area, and a plurality of second upper dummy patterns, which overlap the folding area, and an area occupied by the second upper dummy patterns may be different from an area occupied by the first upper dummy patterns.

The number of second upper dummy patterns may be greater than the number of first upper dummy patterns.

At least one of the second upper dummy patterns may be divided into multiple parts.

The number of second upper dummy patterns may be smaller than the number of first upper dummy patterns.

At least one of the second upper dummy patterns may be unbroken.

According to an exemplary embodiment of the present invention, there is provided a display device including: a display panel; and a digitizer overlapped by the display panel, wherein the digitizer includes a base layer, a folding area, first circuit patterns disposed on a first surface of the base layer and extending in a first direction, a plurality of first dummy patterns disposed in regions within the first circuit patterns, second circuit patterns disposed on a second surface of the base layer and extending in a second direction that intersects the first direction, and a plurality of second dummy patterns disposed in regions within the second circuit patterns, the first dummy patterns include a plurality of first upper dummy patterns, which do not overlap the folding area, and a plurality of second upper dummy patterns, which overlap the folding area, and a direction in which the second upper dummy patterns extend intersects a direction in which the first upper dummy patterns extend.

The folding area may include a folding line, which is a long side of the folding area.

The direction in which the second upper dummy patterns extend may intersect the folding line, and the direction in which the first upper dummy patterns extend may be parallel to the folding line.

The direction in which the second upper dummy patterns extend may be parallel to the folding line, and the direction in which the first upper dummy patterns extend may intersect the folding line.

The second dummy patterns may include a plurality of first lower dummy patterns, which do not overlap the folding area, and a plurality of second lower dummy patterns, which overlap the folding area.

A direction in which the second lower dummy patterns extend may intersect both a direction in which the first lower dummy patterns extend and the folding line.

The direction in which the second lower dummy patterns extend may intersect a direction in which the first lower dummy patterns extend and may be parallel to the folding line.

According to an exemplary embodiment of the present invention, there is provided a display device including: a display panel; and a digitizer overlapped by the display panel, wherein the digitizer includes a base layer, a folding area, first circuit patterns disposed on a first surface of the base layer and extending in a first direction, a plurality of first dummy patterns disposed in regions formed by the first circuit patterns, second circuit patterns disposed on a second surface of the base layer and extending in a second direction that intersects the first direction, and a plurality of second dummy patterns disposed in regions formed by the second circuit patterns, and the first dummy patterns and the second dummy patterns do not overlap the folding area.

The second dummy patterns may be disposed adjacent to each other with the folding area interposed therebetween.

According to an exemplary embodiment of the present invention, there is provided a display device including: a display panel; and a digitizer overlapped by the display panel, wherein the digitizer includes a base layer, a folding area, a plurality of first circuit patterns on a first side of the base layer and a plurality of second circuit patterns on a second side of the base layer, at least one of the first circuit patterns includes a plurality of first dummy patterns overlapping the base layer and not located in the folding area, and at least one of the second circuit patterns includes a plurality of second dummy patterns overlapping the base layer and not located in the folding area.

At least one of the first dummy patterns may overlap at least one of the second dummy patterns.

The at least one first circuit pattern may extend in a first direction and the at least one second circuit pattern may extend in a second direction crossing the first direction.

The display device may further include an adhesive layer overlapping the at least one first circuit pattern and contacting the first side of the base layer.

A thickness of the adhesive layer in the folding area may be less than a thickness of the adhesive layer overlapping the at least one first circuit pattern.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

Exemplary embodiments of the present invention will now be described more fully hereinafter with reference to the accompanying drawings. This invention may, however, be embodied in different forms and should not be construed as limited to the embodiments set forth herein.

It will also be understood that when a layer is referred to as being "on" another layer or substrate, it can be directly on the other layer or substrate, or intervening layers may also be present. The same reference numbers may indicate the same components throughout the specification.

Figure 1:
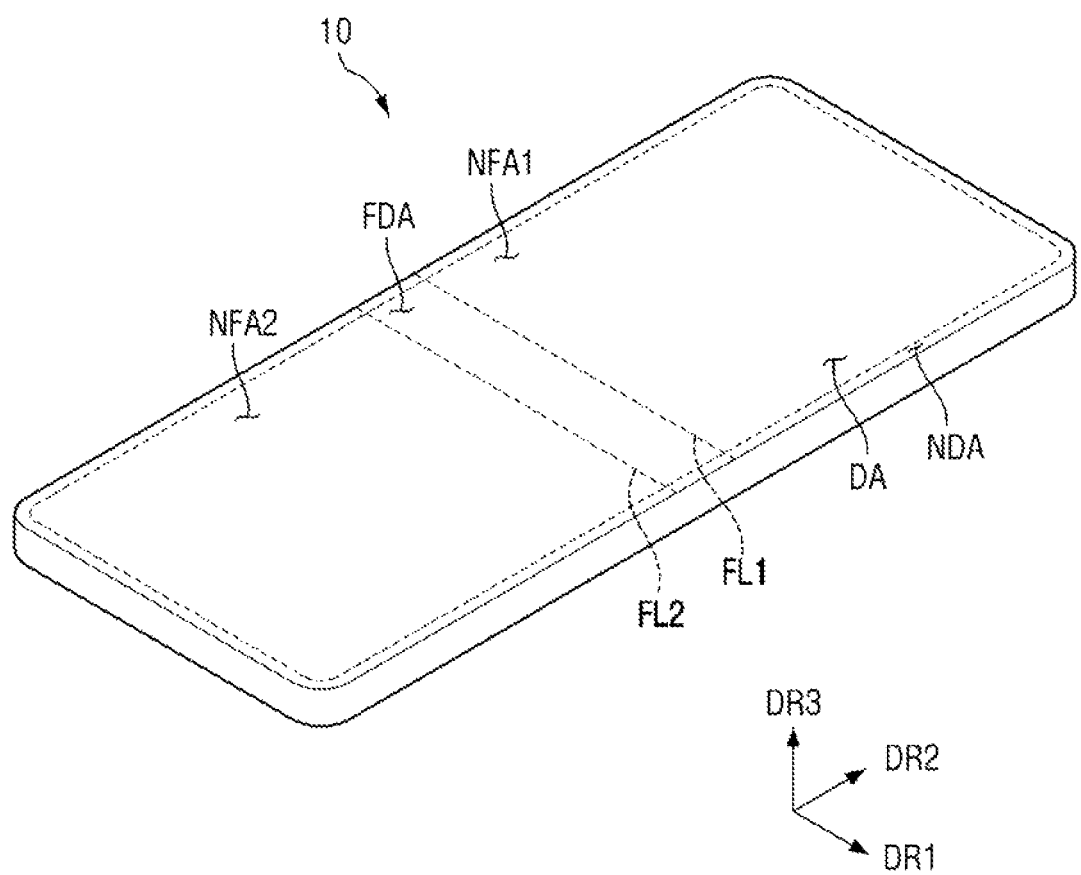
FIG. 1 is a perspective view of a display device according to an exemplary embodiment of the present invention in its unfolded state.
Figure 2:
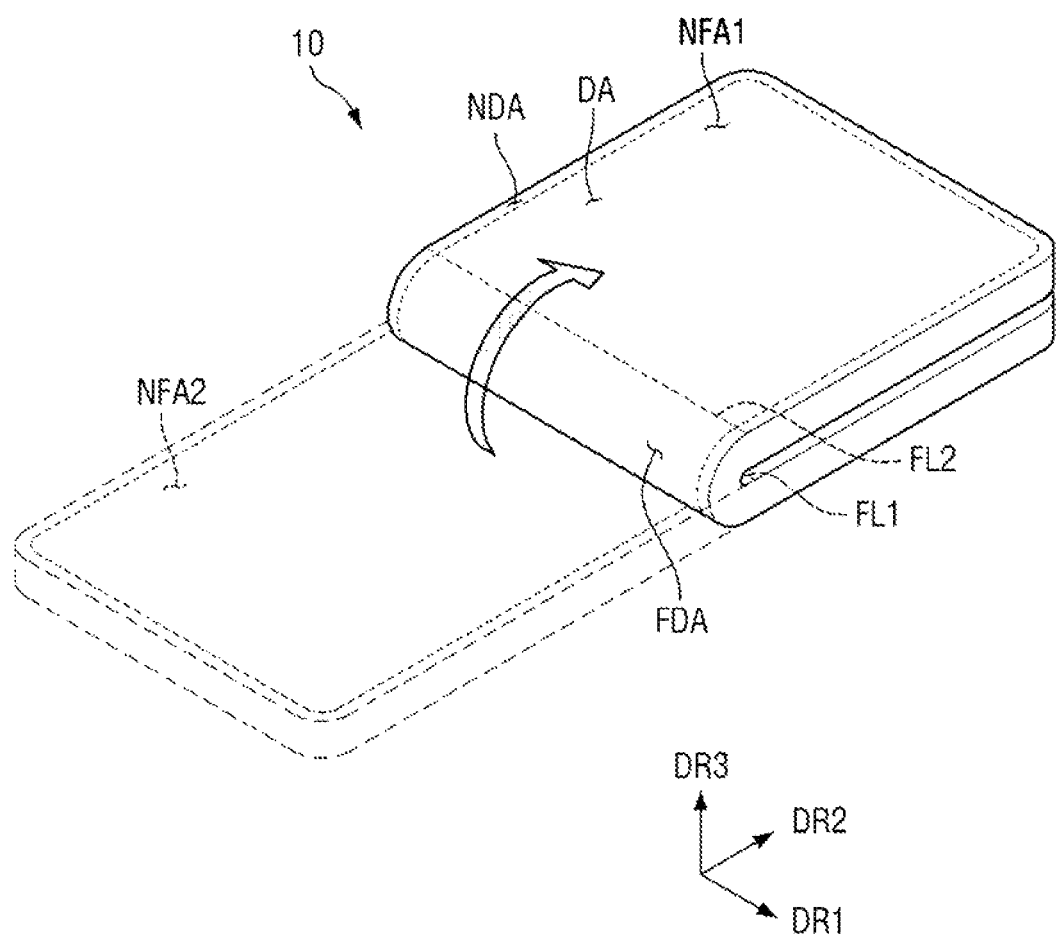
FIG. 2 is a perspective view of the display device of FIG. 1 in its folded state.
Figure 3:
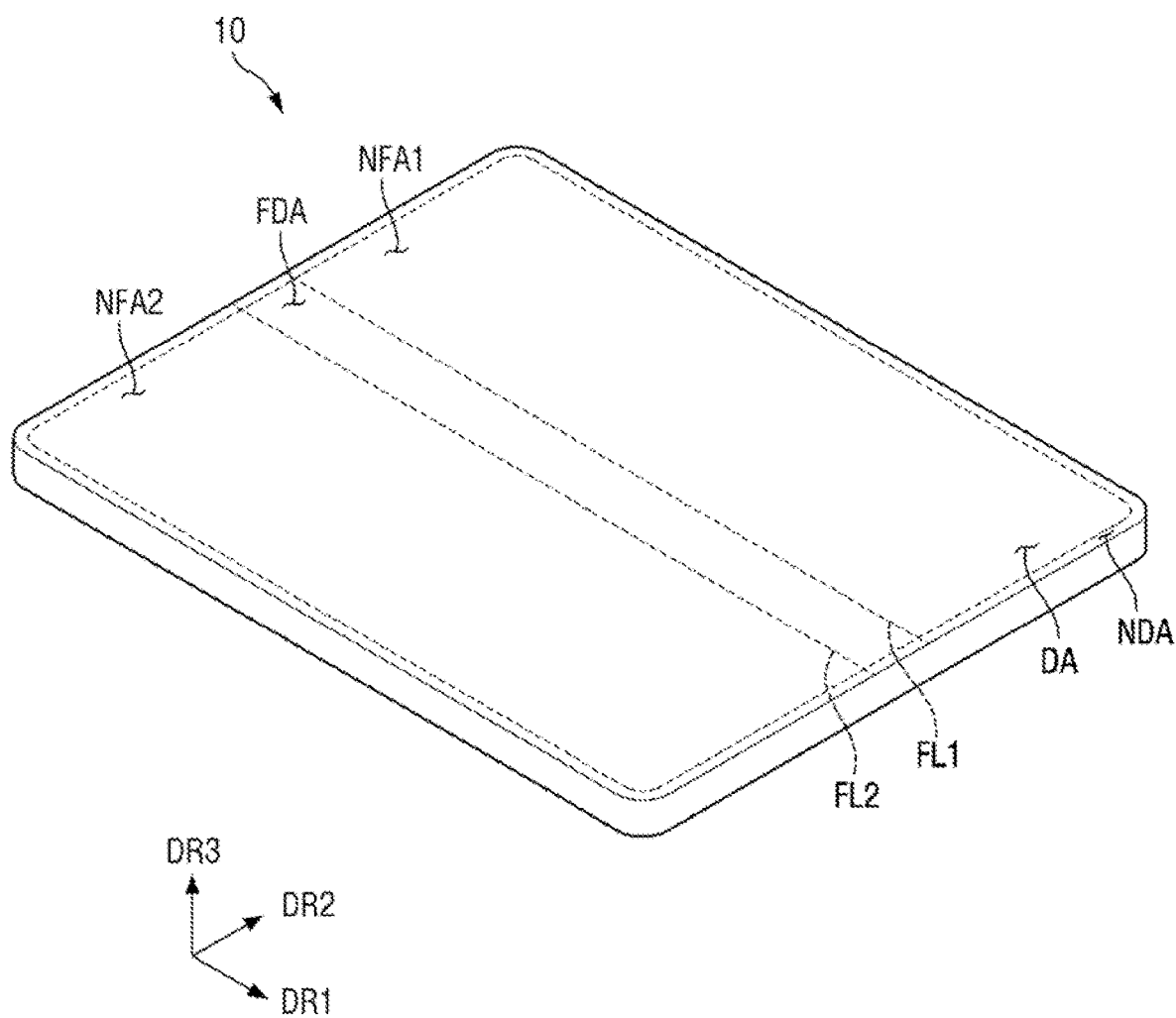
FIG. 3 is a perspective view of another display device according to an exemplary embodiment of the present invention in its unfolded state.
Figure 4:
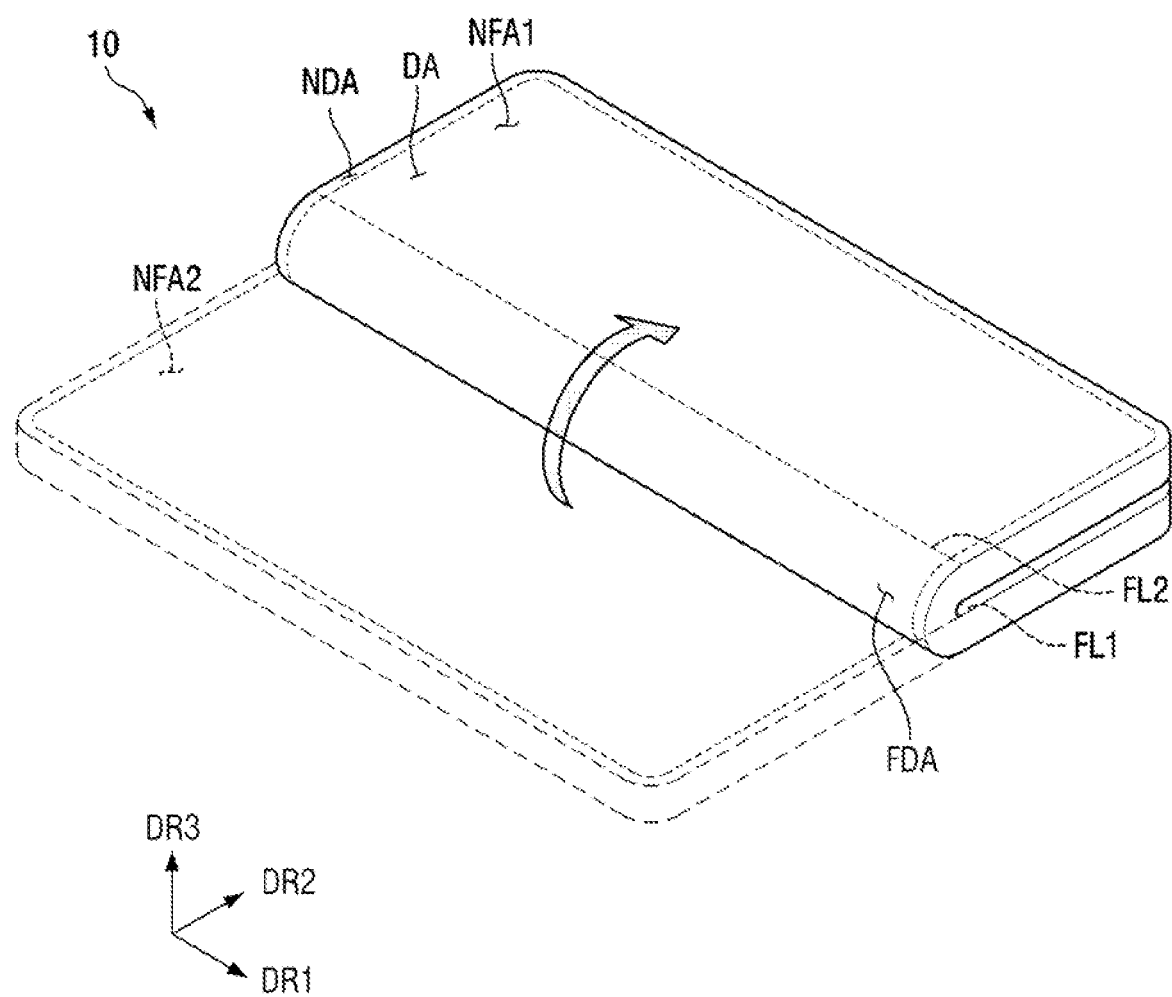
FIG. 4 is a perspective view of the display device of FIG. 3 in its folded state.

FIG. 1 is a perspective view of a display device according to an exemplary embodiment of the present invention in its unfolded state. FIG. 2 is a perspective view of the display device of FIG. 1 in its folded state. FIG. 3 is a perspective view of another display device according to an exemplary embodiment of the present invention in its unfolded state. FIG. 4 is a perspective view of the display device of FIG. 3 in its folded state.

Referring to FIG. 1, a display device 10 may be a foldable display device. The display device 10 will hereinafter be described as being applicable to a smartphone, but the present invention is not limited thereto. In other words, the display device 10 may also be applicable to a portable phone other than a smartphone, a tablet personal computer (PC), a personal digital assistant (PDA), a portable multimedia player (PMP), a television (TV), a gaming console, a wristwatch-type electronic device, a head-mounted display (HMD), the monitor of a PC, a notebook computer, a car navigation device, a car dashboard, a digital camera, a camcorder, an external billboard, an electronic board, a medical device, a testing device, various home appliances such as a refrigerator or a washing machine, or an Internet-of-Things (IoT) device.

The display device 10 may be classified in various manners depending on how it displays an image. Examples of the display device 10 include an organic light-emitting diode (OLED) display device, an inorganic light-emitting diode (ILED) display device, a quantum-dot light-emitting diode (QLED) display device, a micro light-emitting diode (micro LED) display device, a nano light-emitting diode (nano LED) display device, a field emission display (FED) device, and an electrophoretic display (EPD) device. The display device 10 will hereinafter be described as being an OLED display device, which may be referred to simply as a display device, but the present invention is not limited thereto. In other words, the display device 10 may also be applicable to various other display devices that are listed above and/or known to the field to which this disclosure pertains.

Referring to FIGS. 1 and 2, a first direction DR1, which is parallel to a first side of the display device 10 in a plan view, may be, for example, the horizontal direction of the display device 10, a second direction DR2, which is parallel to a side of the display device 10 that meets the first side of the display device 10, in a plan view, may be, for example, the vertical direction of the display device 10, and a third direction DR3 may be the thickness direction of the display device 10.

The display device 10 may have a rectangular shape in a plan view. In a plan view, the display device 10 may have a rectangular shape with right-angled or rounded corners. The display device 10 may include two short sides arranged in the first direction DR1 and two long sides arranged in the second direction DR2 in a plan view.

The display device 10 may include a display area DA and a non-display area NDA. In a plan view, the shape of the display area DA may correspond to the shape of the display device 10. For example, in a case where the display device 10 has a rectangular shape in a plan view, the display area DA may also have a rectangular shape in a plan view.

The display area DA may be an area that includes a plurality of pixels and displays an image. The pixels may be arranged in rows and columns. The pixels may have a rectangular, rhombus, or square shape in a plan view, but the present invention is not limited thereto. For example, the pixels may have a tetragonal shape other than a rectangular, rhombus, or square shape, a non-tetragonal polygonal shape, a circular shape, or an elliptical shape in a plan view.

The non-display area NDA may be an area that does not include pixels and does not display an image. The non-display area NDA may be disposed around the display area DA. The non-display area NDA may be disposed to surround the display area DA, as illustrated in FIGS. 1 and 2, but the present invention is not limited thereto. The display area DA may be surrounded in-part by the non-display area NDA.

The display device 10 may be folded or unfolded. The display device 10 may be in-folded so that the display area DA may be placed on the inside of the display device 10, as illustrated in FIG. 2. In this case, portions of the top surface of the display device 10 may be disposed to face each other. In other words, display surfaces of the display device 10 face each other. Alternatively, the display device 10 may be out-folded so that the display area DA may be placed on the outside of the display device 10. In this case, portions of the bottom surface of the display device 10 may be disposed to face each other. In other words, non-display surfaces of the display device 10 face each other.

The display device 10 may include a folding area FDA, a first non-folding area NFA1, and a second non-folding area NFA2. The folding area FDA may be an area where the display device 10 is folded, and the first and second non-folding areas NFA1 and NFA2 may be areas where the display device 10 is not folded. For example, the folding area FDA is flexible and the first and second non-folding areas NFA1 and NFA2 may be rigid.

The first non-folding area NFA1 may be disposed on one side, for example, the upper side, of the folding area FDA. In other words, the first non-folding area NFA1 may be disposed on a first side of the folding area FDA. The second non-folding area NFA2 may be disposed on the other side, for example, the lower side, of the folding area FDA. In other words, the second non-folding area NFA2 may be disposed on a second side of the folding area FDA. The folding area FDA may be an area that is curved with a predetermined curvature, between first and second folding lines FL1 and FL2. Thus, the first folding line FL1 may be the boundary between the folding area FDA and the first non-folding area NFA1, and the second folding line FL2 may be the boundary between the folding area FDA and the second non-folding area NFA2. The first folding line FL1 may be one of the long sides of the folding area FDA, and the second folding line FL2 may be the other long side of the folding area FDA.

The first and second folding lines FL1 and FL2 may extend in the first direction DR1, as illustrated in FIG. 1, and the display device 10 may be folded up in the second direction DR2. As a result, the length, in the second direction DR2, of the display device 10 can be reduced by about half so that a user can easily carry the display device 10.

The direction in which the first and second folding lines FL1 and FL2 extend is not limited to the first direction DR1. For example, the first and second folding lines FL1 and FL2 may extend in the second direction DR2, and the display device 10 may be folded in the first direction DR1. In this case, the length, in the first direction DR1, of the display device 10 can be reduced by about half. In addition, the first and second folding lines FL1 and FL2 may extend in a diagonal direction between the first and second directions DR1 and DR2. In this case, the display device 10 may be folded into a triangle.

FIGS. 1 and 2 illustrate that each of the display area DA and the non-display area NDA overlaps with the folding area FDA, the first non-folding area NFA1, and the second non-folding area NFA2, but the present invention is not limited thereto. For example, each of the display area DA and the non-display area NDA may overlap with at least one of the folding area FDA, the first non-folding area NFA1, and the second non-folding area NFA2.

Referring to FIGS. 3 and 4, a first direction DR1, which is parallel to a first side of the display device 10 in a plan view, may be, for example, the vertical direction of the display device 10, a second direction DR2, which is parallel to a side of the display device 10 that meets the first side of the display device 10, in a plan view, may be, for example, the horizontal direction of the display device 10, and a third direction DR3 may be the thickness direction of the display device 10.

The display device 10 may have a rectangular shape in a plan view. In a plan view, the display device 10 may have a rectangular shape with right-angled or rounded corners. The display device 10 may include two long sides arranged in the first direction DR1 and two short sides arranged in the second direction DR2 in a plan view.

The display device 10 may include a display area DA and a non-display area NDA. In a plan view, the shape of the display area DA may correspond to the shape of the display device 10. For example, in a case where the display device 10 has a rectangular shape in a plan view, the display area DA may also have a rectangular shape in a plan view.

The display device 10 may be folded or unfolded. The display device 10 may be in-folded so that the display area DA may be placed on the inside of the display device 10, as illustrated in FIG. 4. Alternatively, the display device 10 may be out-folded so that the display area DA may be placed on the outside of the display device 10. The display device 10 may include a folding area FDA, a first non-folding area NFA1, and a second non-folding area NFA2. The folding area FDA may be an area that is curved with a predetermined curvature, between first and second folding lines FL1 and FL2. The first and second folding lines FL1 and FL2 may extend in the first direction DR1, as illustrated in FIGS. 3 and 4, and the display device 10 may be folded up in the second direction DR2. As a result, the length, in the second direction DR2, of the display device 10 can be reduced by about half so that a user can easily carry the display device 10.

Figure 5:
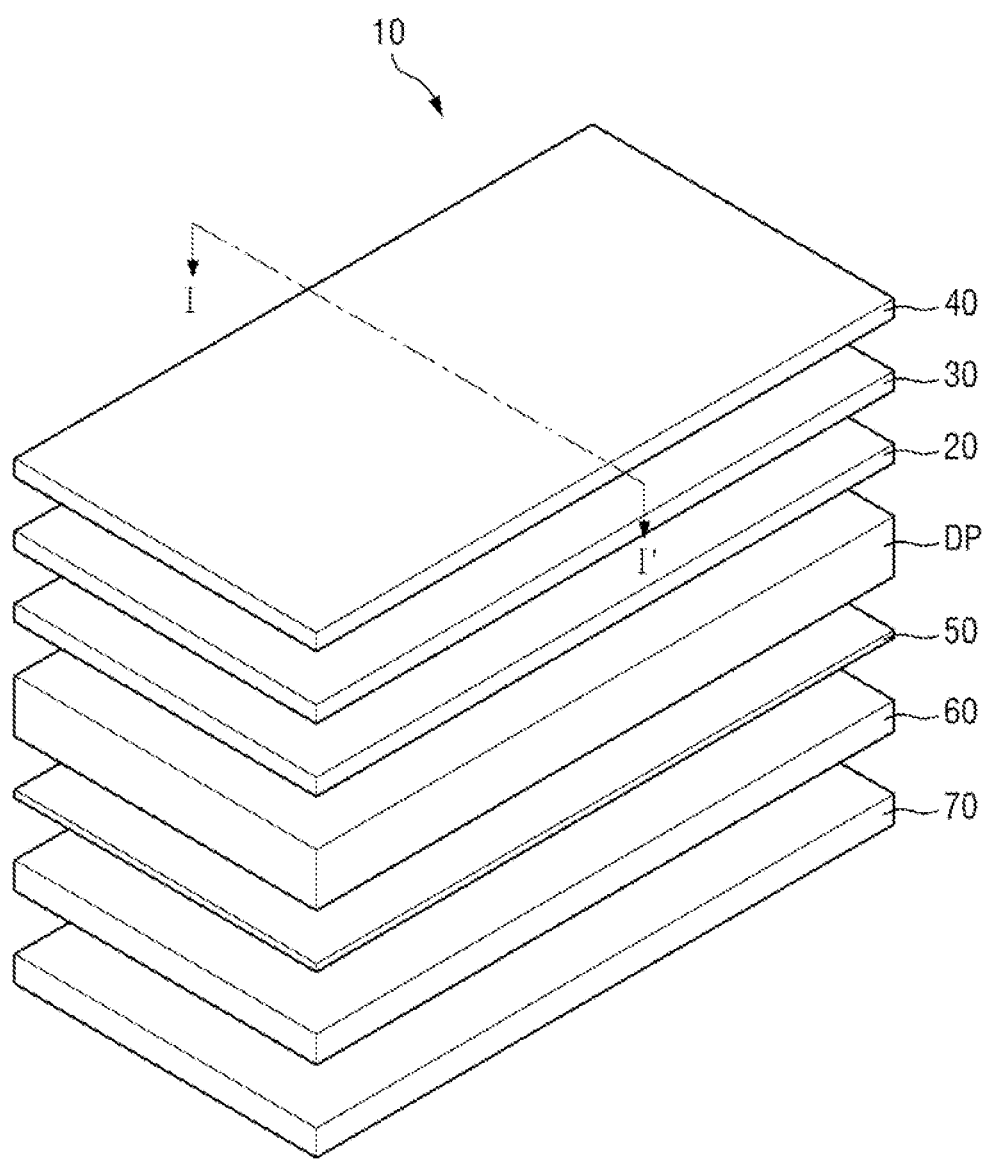
FIG. 5 is an exploded perspective view of a display device according to an exemplary embodiment of the present invention.
Figure 6:
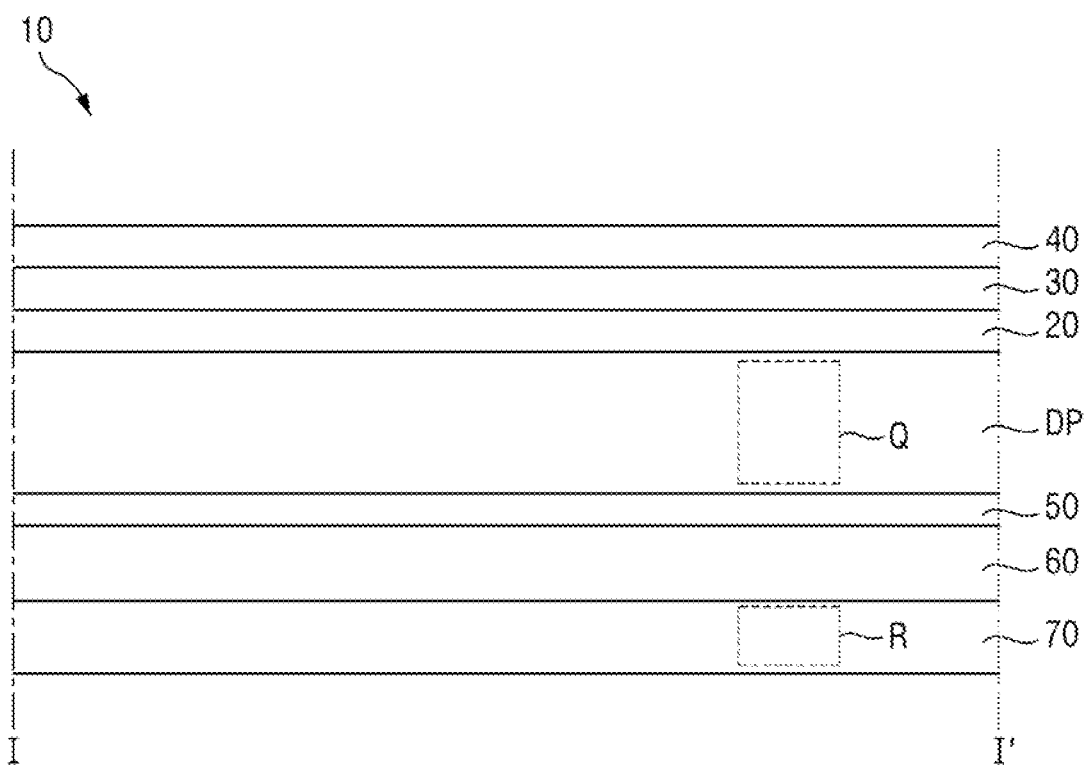
FIG. 6 is a cross-sectional view taken along line I-I' of FIG. 5.
Figure 7:
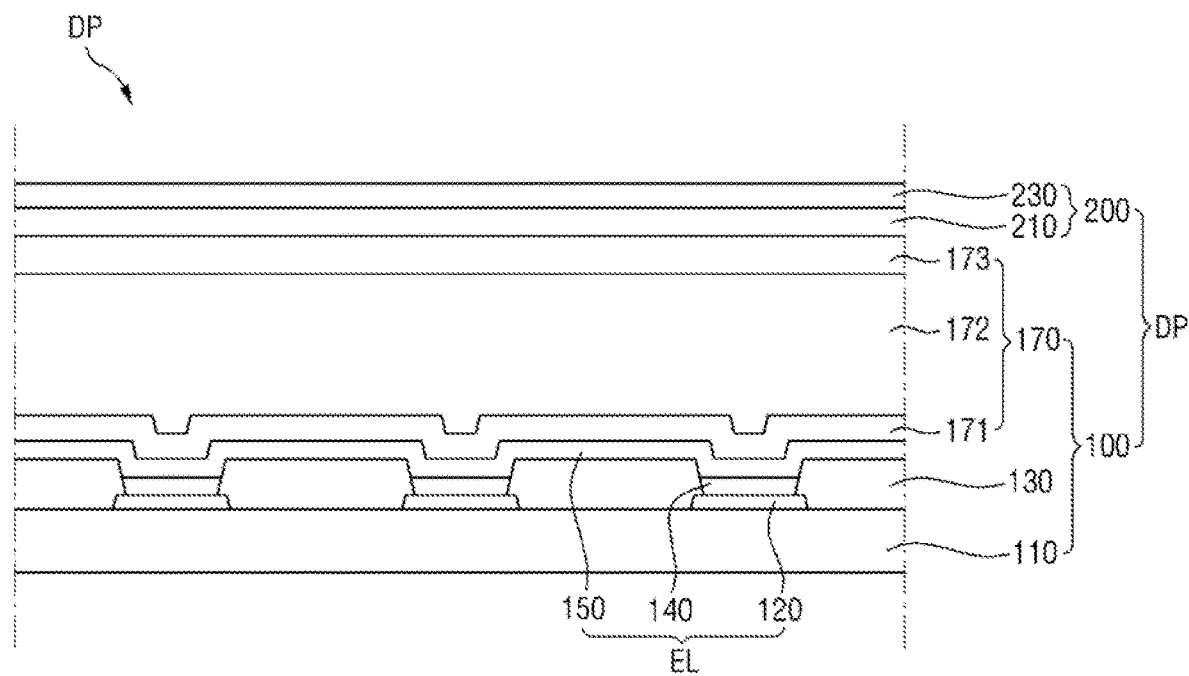
FIG. 7 is an enlarged cross-sectional view of portion Q of FIG. 6.
Figure 8:
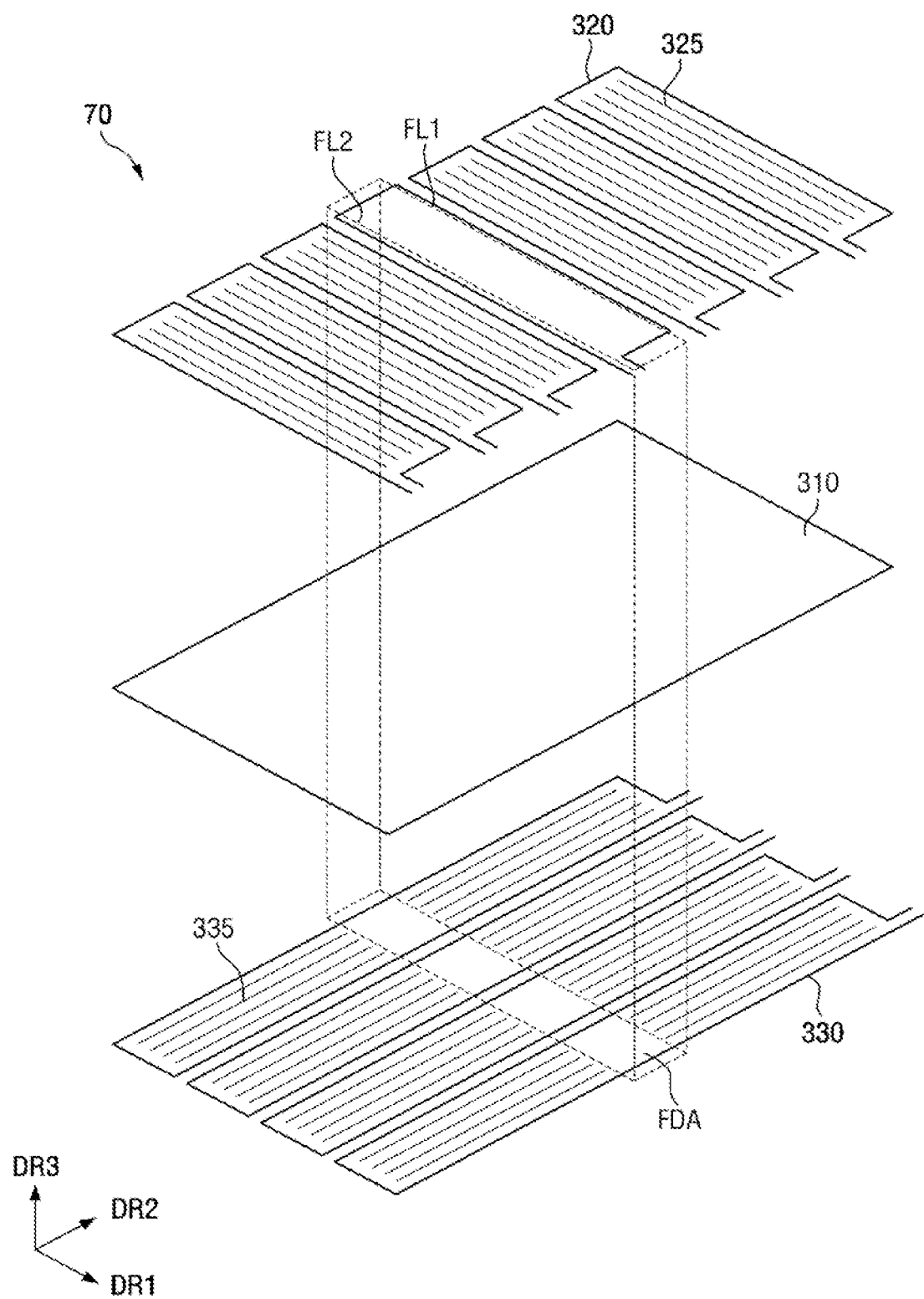
FIG. 8 is an exploded perspective view of a digitizer according to an exemplary embodiment of the present invention.
Figure 9:
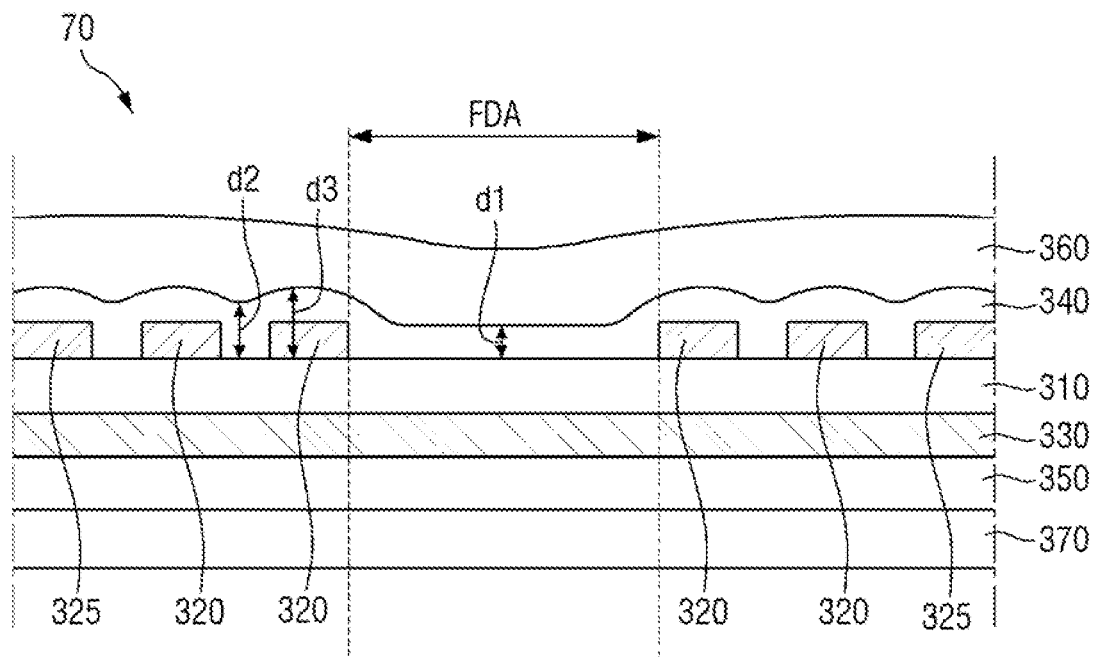
FIG. 9 is an enlarged cross-sectional view of portion R of FIG. 6.
Figure 10:
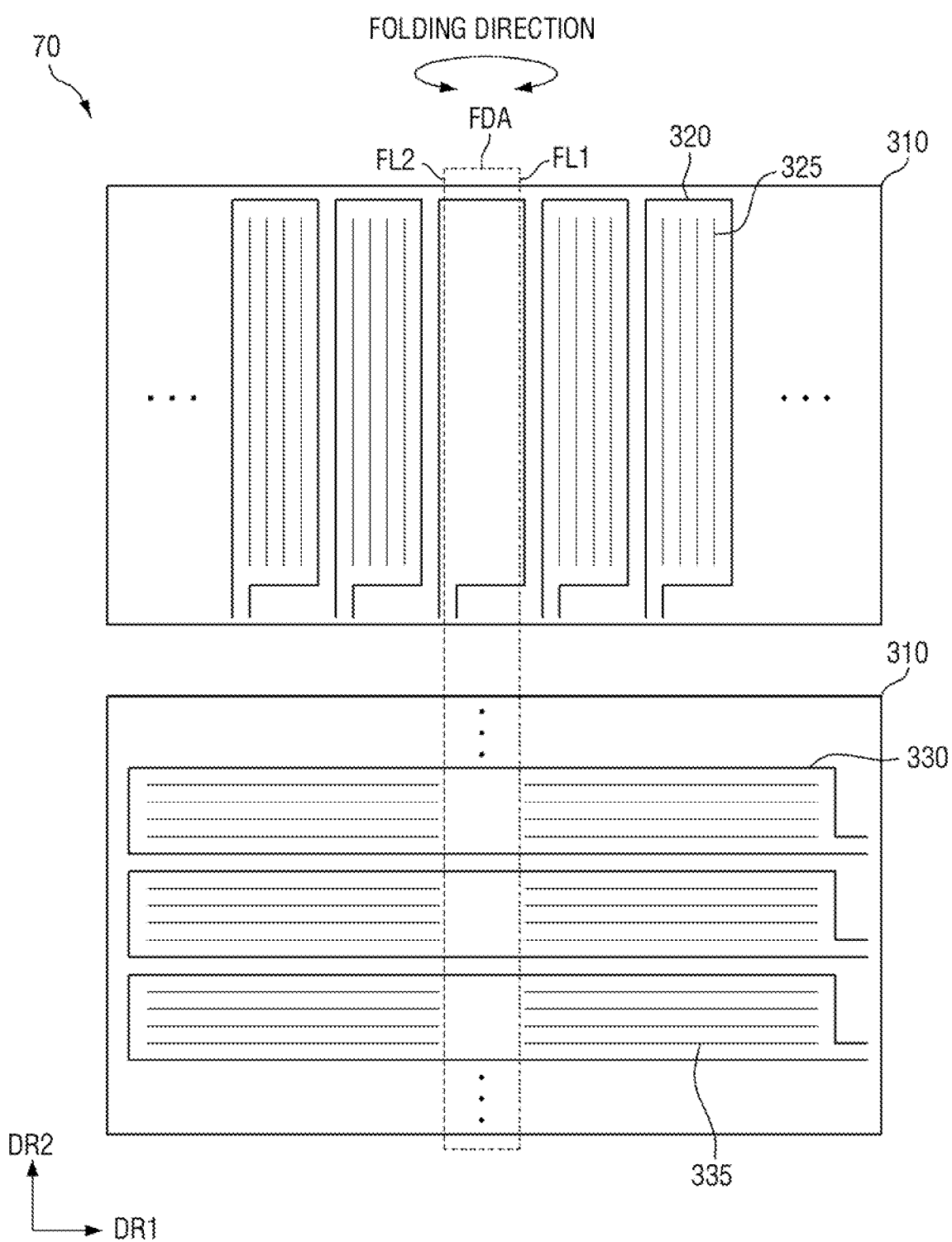
FIG. 10 is a plan view illustrating first circuit patterns and second circuit patterns of the digitizer of FIG. 8.
Figure 11:
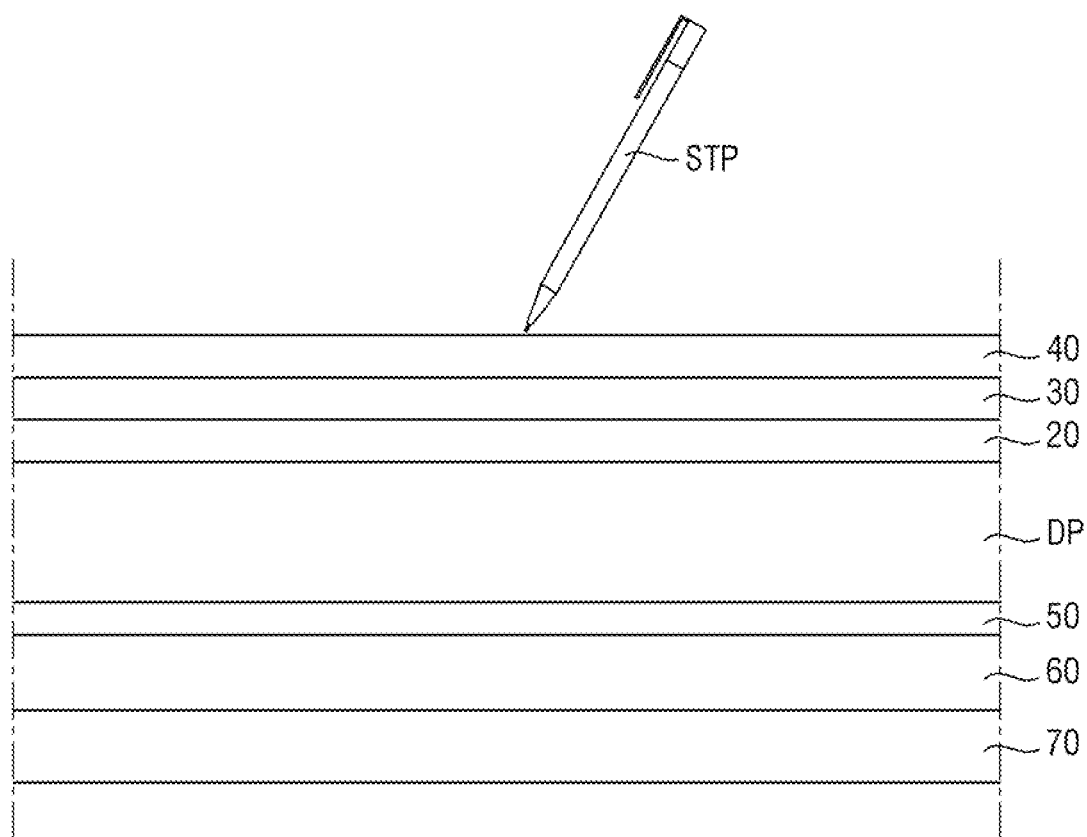
FIG. 11 is a cross-sectional view illustrating a display device according to an exemplary embodiment of the present invention, being touched by a stylus.

FIG. 5 is an exploded perspective view of a display device according to an exemplary embodiment of the present invention. FIG. 6 is a cross-sectional view taken along line I-I' of FIG. 5. FIG. 7 is an enlarged cross-sectional view of portion Q of FIG. 6. FIG. 8 is an exploded perspective view of a digitizer according to an exemplary embodiment of the present invention. FIG. 9 is an enlarged cross-sectional view of portion R of FIG. 6. FIG. 10 is a plan view illustrating first circuit patterns and second circuit patterns of the digitizer of FIG. 8. FIG. 11 is a cross-sectional view illustrating the display device according to an exemplary embodiment of the present invention, being touched by a stylus.

Referring to FIGS. 5 through 7, the display device 10 may include a display panel structure DP and a digitizer 70, which is disposed below the display panel structure DP. The display device 10 may further include a protective film 40, which is disposed on the display panel structure DP, a window 30, which is disposed between the protective film 40 and the display panel structure DP, and a functional layer 20, which is disposed between the window 30 and the display panel structure DP.

The protective film 40 may be disposed on the window 30 to protect the window 30. The protective film 40 may overlap the window 30 and cover the top surface of the window 30. The protective film 40 may cover the entire top surface of the window 30 or at least portion of the top surface of the window 30. The protective film 30 may directly contact the top surface of the widow 30.

The protective film 40 may be freely detachable from the window 30. For example, the protective film 40 may or may not be attached to the window 30 depending on the user's choice. The protective film 40 may be formed of a polymer resin having flexible characteristics. For example, the protective film 40 may include a polyimide resin, an acrylic resin, a methacrylic resin, a polyisoprene resin, a vinyl resin, an epoxy resin, a urethane resin, a cellulose resin, or a perylene resin.

The window 30 may be disposed on the display panel structure DP to protect the display panel structure DP. The window 30 may overlap the display panel structure DP and cover the entire surface of the display panel structure DP. The window 30 may be larger than the display panel structure DP. For example, the window 30 may protrude beyond the display panel structure DP, on both short sides of the display device 10. The window 30 may also protrude beyond the display panel structure DP, on both long sides of the display device 10. The distance by which the window 30 protrudes beyond the display panel structure DP may be greater than on the short sides of the display device 10 than on the long sides of the display device 10. However, the distance by which the window 30 protrudes beyond the display panel structure DP may be greater than on the long sides of the display device 10 than on the short sides of the display device 10.

The window 30 may be formed of a material such as glass or plastic. The window 30 may have flexible properties. In a case where the window 30 is formed of a glass material, the window 30 may be formed of ultrathin glass (UTG) to have flexibility. In this case, the window 30 may have a thickness of 500 µm, e.g., 25 µm to 125 µm, but the present invention is to not limited thereto. The window 30 may include a polymer resin such as a polyimide resin, an acrylic resin, a methacrylic resin, a polyisoprene resin, a vinyl resin, an epoxy resin, a urethane resin, a cellulose resin, or a perylene resin.

The functional layer 20 may be disposed between the window 30 and the display panel structure DP. For example, the functional layer 20 may directly contact the window 30 and the display panel structure DP. In a case where the window 30 is formed of a glass material, the functional layer 20 may be an anti-scattering film. Thus, if the window 30 is broken, fragments of the window 30 can be prevented from scattered because the functional layer 20, which is an anti-scattering film, is coupled to the bottom of the window 30.

However, the present invention is not limited thereto. Alternatively, the functional layer 20 may be a layer that reduces the reflection of external light incident from above the window 30, e.g., an anti-reflective film. For example, the functional layer 20 may include a retarder and a polarizer. The retarder may be of a film type or a liquid crystal coating type and may include a λ/2 retarder and/or a λ/4 retarder. The polarizer may also be of a film type or a liquid crystal coating type. A film-type retarder or polarizer may include a stretched synthetic resin film, and a liquid crystal coating-type retarder or polarizer may include liquid crystal molecules arranged in a predetermined fashion.

The functional layer 20 may include an offset interference structure. For example, the offset interference structure may include first and second reflective layers, which are disposed on different layers. In this case, first reflected light from the first reflective layer and second reflected light from the second reflective layer may offset each other, and as a result, the reflection of external light can be reduced.

The window 30 and the functional layer 20 may be bonded to each other via an optically clear adhesive (OCA) or an optically clear resin (OCR).

Referring to FIG. 7, the display panel structure DP may include a display panel 100 and a touch sensor 200, which is disposed on the display panel 100.

The display panel 100 may be a display panel including self-emitting elements. For example, the self-emitting elements may include OLEDs, QLEDs, inorganic material-based micro LEDs, and/or inorganic material-based nano LEDs. The self-emitting elements will hereinafter be described as being, for example, OLEDs.

The display panel 100 may include a base substrate 110, first electrodes 120, a pixel-defining layer 130, light-emitting layers 140, a second electrode 150, and an encapsulation layer 170.

The base substrate 110 may be an insulating substrate. The base substrate 110 may be flexible and may include a polymer material with flexibility. Here, the polymer material may be polyimide (PI), polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polycarbonate (PC), cellulose triacetate (CAT), cellulose acetate propionate (CAP), or a combination thereof.

The first electrode 120 may be disposed on the base substrate 110. The first electrode 120 may be an anode electrode. Multiple elements may be further disposed between the base substrate 110 and the first electrode 120. The multiple elements may include, for example, a buffer layer, a plurality of conductive lines, an insulating layer, and a plurality of thin-film transistors (TFTs).

The pixel-defining layer 130 may be disposed on the first electrode 120. The pixel-defining layer 130 may include openings that expose at least portions of the first electrodes 120.

The light-emitting layers 140 may be disposed on the first electrodes 120. For example, the light-emitting layers 140 may emit one of red light, green light, and blue light. The red light may have a wavelength of about 520 nm to about 750 nm, the green light may have a wavelength of about 495 nm to about 570 nm, and the blue light may have a wavelength of about 450 nm to about 495 nm. The light-emitting layers 140 may each be formed as a single-layer. Alternatively, each of the light-emitting layers 140 may have a structure in which multiple organic light-emitting layers are stacked, for example, a tandem structure. In another example, the light-emitting layers 140 may emit white light. In this example, each of the light-emitting layers 140 may have a structure in which a red organic light-emitting layer, a green organic light-emitting layer, and a blue organic light-emitting layer are stacked.

The second electrode 150 may be disposed on the light-emitting layers 140 and the pixel-defining layer 130. For example, the second electrode 150 may be formed on the entire surfaces of the light-emitting layers 140 and the entire surface of the pixel-defining layer 130. In other words, the light-emitting layers and the pixel-defining layer 130 may be covered by the second electrode 150. In exemplary embodiments of the present invention, the second electrode 150 may be a cathode electrode.

The first electrodes 120, the second electrode 150, and the light-emitting layers 140 may form light-emitting elements EL.

The encapsulation layer 170 may be disposed on the light-emitting elements EL. The encapsulation layer 170 may seal the light-emitting elements EL to prevent the infiltration of moisture into the light-emitting elements EL. In other words, the encapsulation layer 170 may prevent outside moisture from reaching the light-emitting elements EL.

The encapsulation layer 170 may be a thin film encapsulation layer and may include one or more organic layers and one or more inorganic layers. For example, the encapsulation layer 170 may include a first inorganic layer 171, which is disposed on the second electrode 150, an organic layer 172, which is disposed on the first inorganic layer 171, and a second inorganic layer 173, which is disposed on the organic layer 172. The first inorganic layer 171, the organic layer 172 and the second inorganic layer 173 may be sequentially stacked.

The first inorganic layer 171 may prevent the infiltration of moisture or oxygen into the light-emitting elements EL. The first inorganic layer 171 may be formed of silicon oxide, silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The organic layer 172 may be disposed on the first inorganic layer 171. The organic layer 172 may improve flatness. The organic layer 172 may be formed of a liquid organic material such as, for example, an acrylic resin, a methacrylic resin, polyisoprene, a vinyl resin, an epoxy resin, a urethane resin, a cellulose resin, or a perylene resin. The liquid organic material may be provided on the base substrate 110 via deposition, printing, or coating and may then be subjected to curing.

The second inorganic layer 173 may be disposed on the organic layer 172. The second inorganic layer 173 may perform substantially the same functions as, or similar functions to, the first inorganic layer 171. The second inorganic layer 173 may completely cover the organic layer 172. In exemplary embodiments of the present invention, the first and second inorganic layers 171 and 173 may be in contact with each other to form an inorganic-inorganic junction. However, the structure of the encapsulation layer 170 is not limited thereto and may vary. In exemplary embodiments of the present invention, the encapsulation layer 170 may be formed as a glass substrate.

The touch sensor 200 may be disposed on the encapsulation layer 170. The touch sensor 200 may be disposed directly on the encapsulation layer 170. For example, the touch sensor 200 may directly contact the second inorganic layer 173. In other words, the encapsulation layer 170 may function as a base for the touch sensor 200.

The touch sensor 200 may include a touch element layer 210 and a protective layer 230. The touch element layer 210 may include touch electrodes and touch signal lines, which are connected to the touch electrodes. The touch electrodes may include a metal and may have a mesh shape. In other words, the touch electrodes may be formed as a metal mesh pattern, and as a result, the touch element layer 210 has greater flexibility.

The protective layer 230 may be disposed on the touch element layer 210 and may protect the touch element layer 210. The protective layer 230 may include an organic material such as, for example, an acrylic polymer. In a case where the protective layer 230 is formed of an organic material, the flexibility of the touch sensor 200 can be increased.

Referring to FIGS. 5 and 6, a lower layer 50 may be disposed between the display panel structure DP and the digitizer 70. The lower layer 50 may support the display panel structure DP and may protect the display panel structure DP from shock from therebelow.

The lower layer 50 may include a transparent polymer material. For example, the lower layer 50 may include PI, PES, PA, PAR, PEI, PEN, PET, PPS, polyallylate, PC, CAT, CAP, or a combination thereof.

A buffer member 60 may be disposed below the lower layer 50. The buffer member 60 may absorb external shock and may thereby prevent the display panel structure DP from being damaged or broken. The buffer member 60 may be a cushion layer. The buffer member 60 may be formed as a single-layer layer or a stack of a plurality of layers. The buffer member 60 may include a material with elasticity such as a polyurethane or polyethylene resin. The buffer member 60 may be formed of a sponge-like foam material.

As illustrated in FIGS. 5, 6, 8, and 9, the digitizer 70 may be disposed below the display panel structure DP. The digitizer 70 may detect the approach or contact of an electronic pen (e.g., a stylus) that supports an electromagnetic resonance (EMR) method. The digitizer 70 may include conductive circuit patterns capable of detecting an external electromagnetic force. For example, the digitizer 70 may detect an electromagnetic force emitted from the stylus, with the conductive circuit patterns, and may determine a location where a strongest electromagnetic force is detected as the coordinates of touch input. In addition, the digitizer 70 can differentiate the approach or contact of a portion of the user's body from the approach or contact of the stylus and can thus support a palm rejection function that disregards an unintended touch by a body portion such as the palm. In other words, the digitizer 70 can differentiate between the contact of the stylus and the contact of a portion of the user's body.

The digitizer 70 may include a base layer 310, first circuit patterns 320, and second circuit patterns 330. The digitizer 70 may further include first and second adhesive layers 340 and 350 and first and second cover layers 360 and 370.

The base layer 310 may be flexible and may include an insulating material. The base layer 310 may include an insulating material such as PI.

The base layer 310 may have the folding area FDA of the display device 10 thereon. The folding area FDA of the display device 10 may be the same as the folding area FDA of the base layer 310.

Circuit patterns may be disposed on both surfaces of the base layer 310. The first circuit patterns 320, which extend in the first direction DR1, may be disposed on one surface (or the top surface) of the base layer 310 that faces the display panel structure DP or the display panel 100, and the second circuit patterns 330, which extend in the second direction DR2, may be disposed on the other surface (or the bottom surface) of the base layer 310. In other words, the first circuit patterns 320 may be disposed on a first surface of the base layer 310 and the second circuit patterns 330 may be disposed on a second surface of the base layer 310, the first and second surfaces of the base layer 310 being opposite each other.

The first circuit patterns 320 may be disposed to be a predetermined distance apart from one another in the second direction DR2, and the second circuit patterns 330 may be disposed to be a predetermined distance apart from one another in the first direction DR1. The first circuit patterns 320 and the second circuit patterns 330 may form a lattice structure in a plan view.

At least two first circuit patterns 320 may be electrically connected to form a loop, and at least two second circuit patterns 330 may be electrically connected to form a loop.

The first circuit patterns 320 and the second circuit patterns 330 may include a metallic material such as copper (Cu), silver (Ag), nickel (Ni), or tungsten (W).

The first circuit patterns 320 and the second circuit patterns 330 are illustrated as rectangular loops, but the present invention is not limited thereto. Alternatively, the first circuit patterns 320 and the second circuit patterns 330 may be formed as arrays of rhombuses or hexagons.

The first adhesive layer 340, which covers the first circuit patterns 320, may be disposed on the surface of the base layer 310 that faces the display panel structure DP or the display panel 100. In other words, the first adhesive layer 340 may be disposed on the first surface of the base layer 310. The first adhesive layer 340 may bond the first cover layer 360, which is disposed on the first adhesive layer 340 to protect the first circuit patterns 320. When the digitizer 70 is bent or folded, the first adhesive layer 340 may reduce the stress applied to the first circuit patterns 320, by adjusting the position of the neutral plane.

The first adhesive layer 340 may include an organic material. For example, the first adhesive layer 340 may include an acrylic resin or an epoxy resin. For example, the first adhesive layer 340 may be formed of a pressure sensitive adhesive (PSA).

The second adhesive layer 350, which covers the second circuit patterns 330, may be disposed below the base layer 310. For example, the second adhesive layer 350 may be disposed on the second surface of the base layer 310. The second adhesive layer 350 may bond the second cover layer 370, which is disposed below the second adhesive layer 350 to protect the second circuit patterns 330. When the digitizer 70 is bent or folded, the second adhesive layer 350 may reduce the stress applied to the second circuit patterns 330, by adjusting the position of the neutral plane.

The second adhesive layer 350 may include an organic material. For example, the second adhesive layer 350 may include an acrylic resin or an epoxy resin. For example, the second adhesive layer 350 may be formed of a PSA.

Referring to FIGS. 8 through 10, the first circuit patterns 320 may include, at least in-part, first dummy patterns 325, and the second circuit patterns 330 may include, at least in-part, second dummy patterns 335.

There is a likelihood that the user may recognize the presence of the first circuit patterns 320 and the second circuit patterns 330 because of the height difference between regions where the first circuit patterns 320 and the second circuit patterns 330 exist and regions where the first circuit patterns 320 and the second circuit patterns 330 do not exist, and as a result, the display quality of the display device 10 may deteriorate.

The first dummy patterns 325 may be disposed between the first circuit patterns 320, and the second dummy patterns 335 may be disposed between the second circuit patterns 330. For example, the first dummy patterns 325 may extend in the second direction DR2 between the first circuit patterns 320 extending the second direction DR2 and the second dummy patterns 335 may extend in the first direction DR1 between the second circuit patterns 330 extending the first direction DR1. Thus, the distance between lines such as the first circuit patterns 320, the first dummy patterns 325, the second circuit patterns 330, and the second dummy patterns 335 can be reduced, and as a result, the height difference between regions where the lines exist and regions where the lines do not exist can be reduced.

As illustrated in FIG. 9, the first adhesive layer 340 may have a first thickness d1 in regions where the first circuit patterns 320 and the first dummy patterns 325 do not exist, may have a second thickness d2 between the first circuit patterns 320 and the first dummy patterns 325, and may have a third thickness d3 in the overlapping areas of the first adhesive layer 340 and the first circuit patterns 320. The first thickness d1 may be less than the second thickness d2 and the second thickness d2 may be less than the third thickness d3. Thus, for example, a thickness (e.g., d1) of the first adhesive layer 340 in the folding area FDA is less than a thickness (e.g., d2) of the first adhesive layer 340 overlapping at least one of the first circuit patterns 320.

When the first dummy patterns 325 are not provided, the height difference in the first adhesive layer 340, e.g., the difference between the first and third thicknesses d1 and d3, may be very large. However, since the first dummy patterns 325 are disposed between the first circuit patterns 320, the height difference in the first adhesive layer 340, e.g., the difference between the first and third thicknesses d1 and d3, can be considerably reduced. As a result, the first circuit patterns 320 can be prevented from becoming visible to a user. In addition, since the second dummy patterns 335 are disposed between the second circuit patterns 330, the second circuit patterns 330 can be prevented from becoming visible to a user.

The first dummy patterns 325 may be disposed in regions of the first circuit patterns 320. When the first circuit patterns 320 are formed as rectangles, the regions of the first circuit patterns 320 may be regions of the rectangles. Similarly, the second dummy patterns 335 may be disposed in regions of the second circuit patterns 330.

At least one first dummy pattern 325 may be disposed in each of the regions of the first circuit patterns 320. At least one second dummy pattern 335 may be disposed in each of the regions of the second circuit patterns 330. For example, if a plurality of first dummy patterns 325 are provided in each of the regions of the first circuit patterns 320, the first dummy patterns 325 may be spaced apart from one another in each of the regions of the first circuit patterns 320, and the distance between the first dummy patterns 325 may be uniform or may vary. Similarly, if a plurality of second dummy patterns 335 are provided in each of the regions of the second circuit patterns 330, the second dummy patterns 335 may be spaced apart from one another in each of the regions of the second circuit patterns 330, and the distance between the second dummy patterns 335 may be uniform or may vary.

The first dummy patterns 325 may be arranged in parallel to the lengthwise direction of the first circuit patterns 320. As illustrated in FIG. 8, the first dummy patterns 325 may extend in the first direction DR1. The direction in which the first dummy patterns 325 extend may be parallel to the first or second folding line FL1 or FL2. The second dummy patterns 335 may be arranged in parallel to the lengthwise direction of the second circuit patterns 330. The second dummy patterns 335 may extend in the second direction DR2. The direction in which the second dummy patterns 335 extend may intersect the first or second folding line FL1 or FL2. For example, the direction in which the second dummy patterns 335 extend may perpendicularly intersect the first or second folding line FL1 or FL2.

It is to be understood that the first dummy patterns 325 may extend in the second direction DR2 and the second dummy patterns 335 may extend in the first direction DR1. This configuration and the configuration shown in FIG. 8 may form a lattice or matrix when the first and second dummy patterns 325 and 335 overlap each other. This lattice of matrix configuration may contribute to the display device 10 having reduced wiring visibility.

The first dummy patterns 325 and the second dummy patterns 335 may include a metallic material such as Cu, Ag, Ni, or W. The first dummy patterns 325 and the second dummy patterns 335 may be formed of the same material as the first circuit patterns 320 and the second circuit patterns 330, but the present invention is not limited thereto. Alternatively, the first dummy patterns 325 and the second dummy patterns 335 may be formed of a different material from the first circuit patterns 320 and the second circuit patterns 330.

The first dummy patterns 325 and the second dummy patterns 335 may not overlap with the folding area FDA of the display device 10. In other words, the first dummy patterns 325 and the second dummy patterns 335 may not be located in the folding area FDA of the display device 10. If dummy patterns are disposed in the folding area FDA, the thickness and modulus of the digitizer 70 may increase, and as a result, the dummy patterns may interfere with the folding of the digitizer 70. Thus, by arranging the first dummy patterns 325 and the second dummy patterns 335 not to overlap with the folding area FDA, increases in the thickness and modulus of the digitizer 70 in the folding area FDA can be prevented, and the folding of the digitizer 70 can be facilitated.

As illustrated in FIG. 8, the first dummy patterns 325 may not be disposed in portions of the first circuit patterns 320 that overlap with the folding area FDA, but may be disposed in portions of the first circuit patterns 320 that do not overlap with the folding area FDA. For example, although there may be a first circuit pattern 320 in the folding area FDA, this first circuit pattern 320 does not include a first dummy pattern 325. The second dummy patterns 335 may not be disposed in portions of the second circuit patterns 330 that overlap with the folding area FDA but may be disposed in portions of the second circuit patterns 330 that do not overlap with the folding area FDA. In other words, portions of the second circuit patterns 330 located in the folding area FDA do not include the second dummy patterns 335.

The second dummy patterns 335 may be isolated from one another. The second dummy patterns 335 may be separated from each other with the folding area FDA interposed therebetween. Since the first dummy patterns 325 and the second dummy patterns 335 are disposed not to overlap with the folding area FDA, increases in the thickness and modulus of the digitizer 70 in the folding area FDA can be prevented, and the folding of the digitizer 70 can be facilitated.

The display device 10 may further include an embossed tape, which is disposed on one surface of the buffer member 60 to bond the lower layer 50 and the buffer member 60 and functions as a buffer member. The display device 10 may further include a heat dissipation member, which is disposed on one surface of the buffer member 60 and releases heat emitted from the display panel structure DP. The display device 10 may further include an electromagnetic shielding filter, which is disposed below the digitizer 70 and is capable of blocking an electromagnetic field from the digitizer 70.

FIG. 11 is a cross-sectional view illustrating a display device according to an exemplary embodiment of the present invention, being touched by a stylus. It will hereinafter be described, with reference to FIG. 11, how the display device 10 can sense a touch by a stylus.

Referring to FIG. 11, the top surface of the display device 10, particularly, the top surface of the protective film 40, may be touched by a stylus STP. The stylus STP may be in the form of, for example, a pen, but the present invention is not limited thereto.

Once the digitizer 70 of the display device 10 is touched by the stylus STP, scan signals are sequentially applied to the first circuit patterns 320, and sensing signals may be output to the second circuit patterns 330. The scan signals applied to the first circuit patterns 320 of the digitizer 70 generate an electromagnetic field, and as the stylus STP approaches and is close to the display device 10, a resonance circuit included in the stylus STP receives the electromagnetic field. Thereafter, the stylus STP emits an electromagnetic field to the digitizer 70. In other words, when the electromagnetic field resonated in the stylus STP is emitted to the digitizer 70, the second circuit patterns 330 of the digitizer 70 detect the emitted electromagnetic field and thereby detect the touch by the stylus STP.

Embodiments of the digitizer 70 included in the display device 10 will hereinafter be described with reference to FIGS. 12 through 27.

Figure 12:
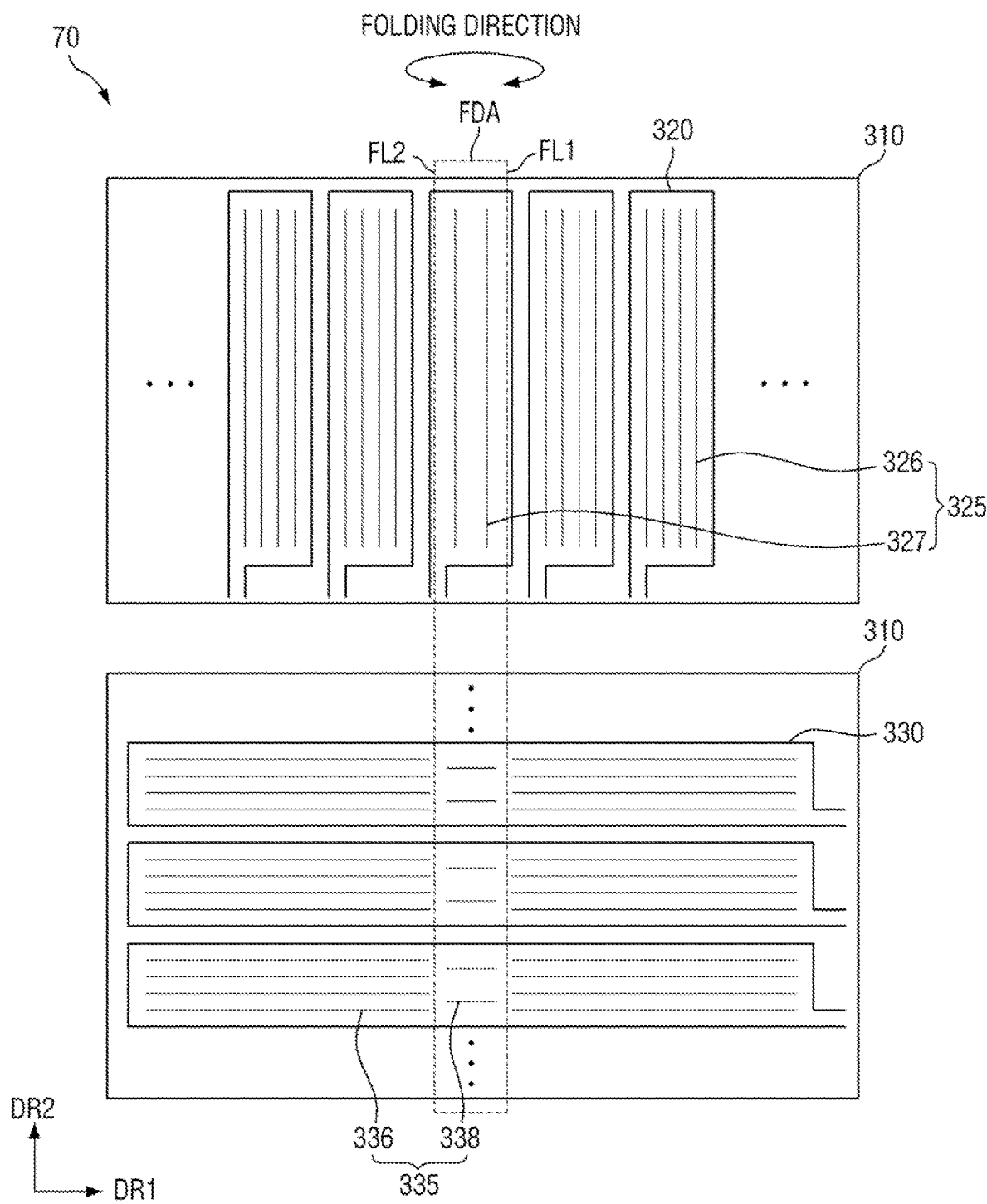
FIG. 12 is a plan view illustrating first circuit patterns and second circuit patterns of a digitizer according to another exemplary embodiment of the present invention.

FIG. 12 is a plan view illustrating first circuit patterns and second circuit patterns of a digitizer according to another exemplary embodiment of the present invention. FIGS. 13 through 20 are plan views illustrating first circuit patterns and second circuit patterns of digitizers according to other exemplary embodiments of the present invention. FIGS. 12 through 20 illustrate layout views of first circuit patterns and first dummy patterns on the top surface of each digitizer and layout views of second circuit patterns and second dummy patterns on the bottom surface of each digitizer together.

Referring to FIGS. 12 through 20, a digitizer 70 may include first circuit patterns 320 and second circuit patterns 330 and may further include first dummy patterns 325 and second dummy patterns 335. The embodiments of FIGS. 12 through 20 are similar to the embodiment of FIG. 10 except that the first dummy patterns 325 and the second dummy patterns 335 are disposed in a folding area FDA, and thus will hereinafter be described, focusing mainly on the differences with the embodiment of FIG. 10.

Referring to FIG. 12, the first dummy patterns 325 may include first upper dummy patterns 326, which are disposed in areas other than the folding area FDA, and second upper dummy patterns 327, which are disposed in the folding area FDA. The first upper dummy patterns 326 may not overlap with the folding area FDA, and the second upper dummy patterns 327 may overlap with the folding area FDA. The first and second upper dummy patterns 326 and 327 may both extend in the second direction DR2.

The area occupied by the second upper dummy patterns 327, which overlap with the folding area FDA, may be smaller than the area occupied by the first upper dummy patterns 326, which do not overlap with the folding area FDA. For example, the number of second upper dummy patterns 327 may be smaller than the number of first upper dummy patterns 326, and as a result, the area occupied by the second upper dummy patterns 327 may be smaller than the area occupied by the first upper dummy patterns 326.

In a case where a plurality of second upper dummy patterns 327 are provided, the distance between the second upper dummy patterns 327 may be greater than the distance between the first upper dummy patterns 326. As mentioned above, if dummy patterns are disposed in the folding area FDA, the display device 10 may not be easily folded. However, since the area occupied by the second upper dummy patterns 327, which overlap with the folding area FDA, is smaller than the area occupied by the first upper dummy patterns 326, which do not overlap with the folding area FDA, the folding of the display device 10 may not be interfered with by the second upper dummy patterns 327.

The second dummy patterns 335 may include first lower dummy patterns 336, which are disposed in the area other than the folding area FDA, and second lower dummy patterns 338, which are disposed in the folding area FDA. The first lower dummy patterns 336 may not overlap with the folding area FDA, and the second lower dummy patterns 338 may overlap with the folding area FDA. The first and second lower dummy patterns 336 and 338 may extend in the first direction DR1 which is different from the extension direction of the first and second upper dummy patterns 326 and 327.

The area occupied by the second lower dummy patterns 338, which overlap with the folding area FDA, may be smaller than the area occupied by the first lower dummy patterns 336, which do not overlap with the folding area FDA. For example, the number of second lower dummy patterns 338 may be smaller than the number of first lower dummy patterns 336, and as a result, the area occupied by the second lower dummy patterns 338 may be smaller than the area occupied by the first lower dummy patterns 336.

In a case where a plurality of second lower dummy patterns 338 are provided, the distance between the second lower dummy patterns 338 may be greater than the distance between the first lower dummy patterns 336. Since the area occupied by the second lower dummy patterns 338, which overlap with the folding area FDA, is smaller than the area occupied by the first lower dummy patterns 336, which do not overlap with the folding area FDA, the folding of the display device 10 may not be interfered with by the second lower dummy patterns 338.

Figure 13:
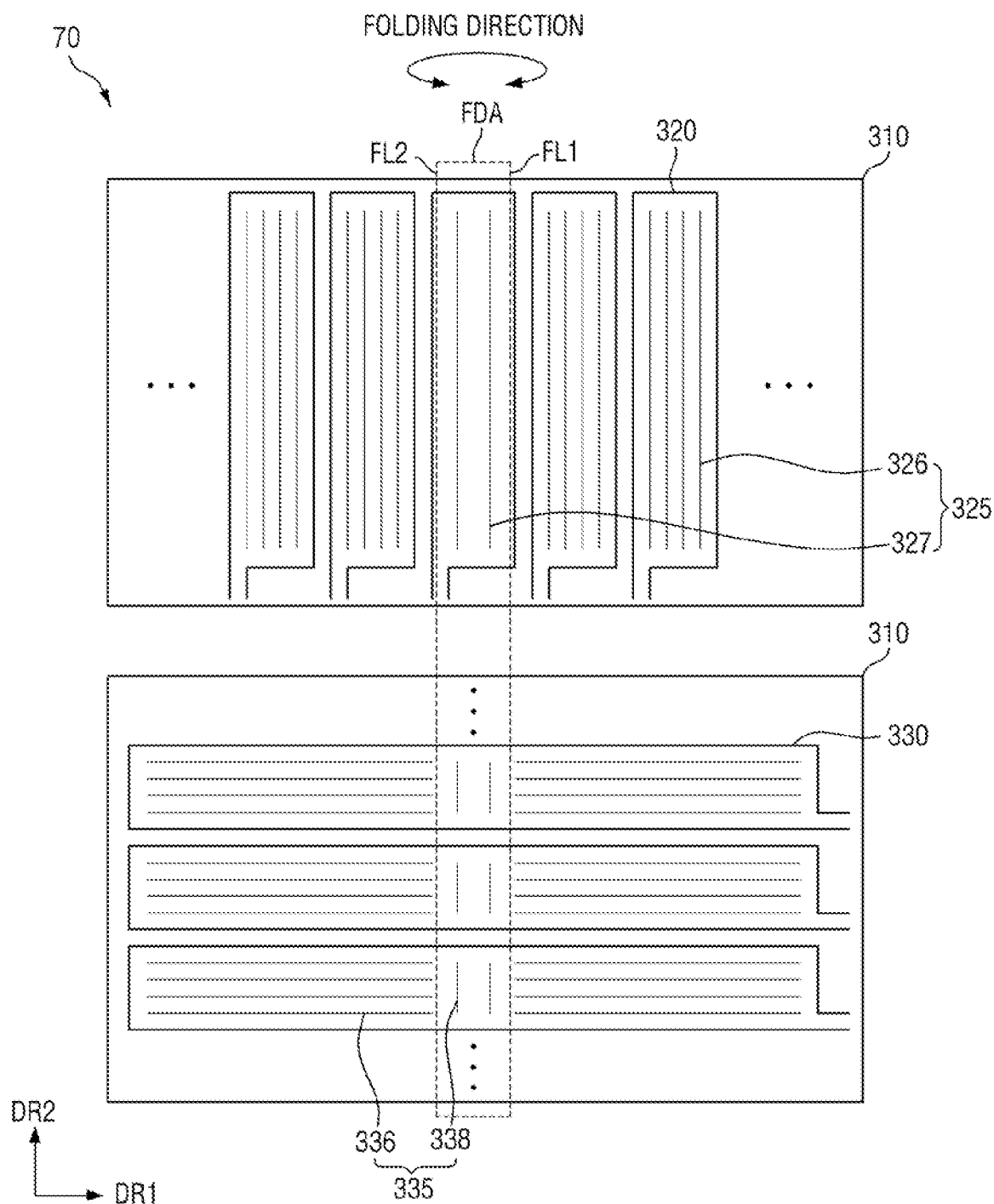
FIGS. 13, 14, 15, 16, 17, 18, 19 and 20 are plan views illustrating first circuit patterns and second circuit patterns of digitizers according to other exemplary embodiments of the present invention.

Referring to FIG. 13, second dummy patterns 335 may include first lower dummy patterns 336, which are disposed in a folding area FDA, and second lower dummy patterns 338, which are disposed in the folding area FDA. The embodiment of FIG. 13 differs from the embodiment of FIG. 12 in that the direction in which the second lower dummy patterns 338 extend is parallel to first and second folding lines FL1 and FL2. For example, the second lower dummy patterns 338 extend in the same direction as the second upper dummy patterns 327.

As illustrated in FIG. 13, the direction in which the first lower dummy patterns 336 extend may perpendicularly intersect the first and second folding lines FL1 and FL2. On the other hand, the direction in which the second lower dummy patterns 338 extend may perpendicularly intersect the direction in which the first lower dummy patterns 336 extend and may be parallel to the first and second folding lines FL1 and FL2.

Since the direction in which the second lower dummy patterns 338 extend is parallel to the first and second folding lines FL1 and FL2, the repelling force of the second lower dummy patterns 338 during the folding of the display device 10 can be reduced so that the folding of the display device 10 can be facilitated.

According to an exemplary embodiment of the present invention, the display device 10 may include a display panel DP; and a digitizer 70 overlapped by the display panel 10. The digitizer 70 includes a base layer 310, a folding area FDA, first circuit patterns 320 disposed on a first surface of the base layer 310 and extending in a first direction (e.g., DR2), a plurality of first dummy patterns 325 disposed in regions defined by the first circuit patterns 320, second circuit patterns 330 disposed on a second surface of the base layer 310 and extending in a second direction (e.g., DR1) that intersects the first direction, and a plurality of second dummy patterns 335 disposed in regions defined by the second circuit patterns 330. The second dummy patterns 335 may include a plurality of first lower dummy patterns 336, which do not overlap the folding area FDA, and a plurality of second lower dummy patterns 338, which overlap the folding area FDA.

In an exemplary embodiment of the present invention, an area occupied by the second lower dummy patterns 338 is smaller than an area occupied by the first lower dummy patterns 336.

In an exemplary embodiment of the present invention, the first dummy patterns 335 may include a plurality of first upper dummy patterns 326, which do not overlap the folding area FDA, and a plurality of second upper dummy patterns 327, which overlap the folding area FDA.

In an exemplary embodiment of the present invention, an area occupied by the second upper dummy patterns 327 is different from an area occupied by the first upper dummy patterns 326.

Figure 14:
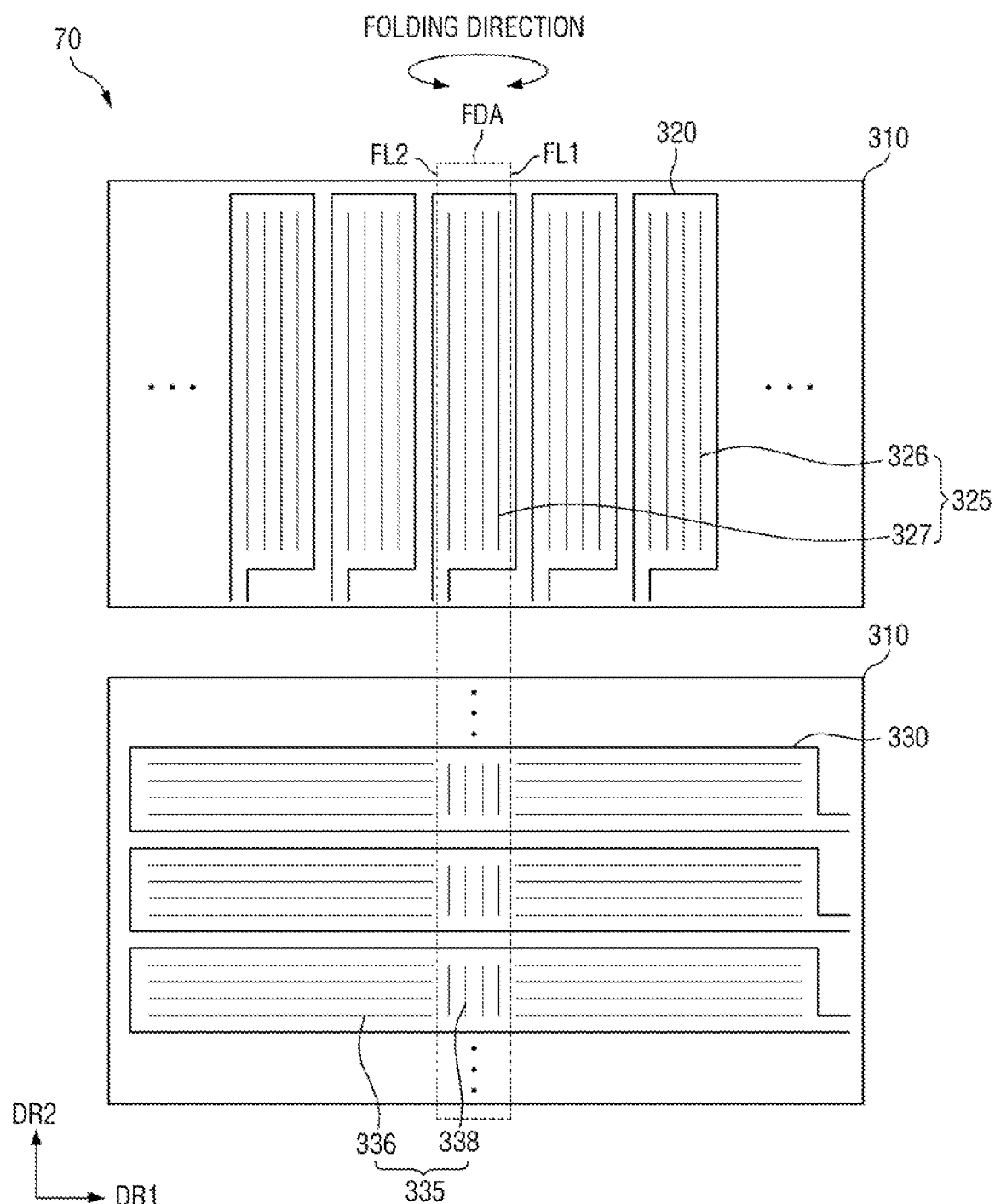

The embodiment of FIG. 14 differs from the embodiment of FIG. 13 in that the number of second upper dummy patterns 327 is the same as the number of first upper dummy patterns 326 per first circuit pattern 320, and that the number of second lower dummy patterns 338 is the same as the number of first lower dummy patterns 336 per second circuit pattern 330.

Referring to FIG. 14, the direction in which the second upper dummy patterns 327 extend and the direction in which the second lower dummy patterns 338 extend may be parallel to first and second folding lines FL1 and FL2. In other words, the second upper dummy patterns 327 and the second lower dummy patterns 338 may extend in the same direction. The direction in which the second upper dummy patterns 327 extend and the direction in which the second lower dummy patterns 338 extend may be parallel to each other. Thus, as the numbers of second upper dummy patterns 327 and second lower dummy patterns 338 increase, the repelling forces of the second upper dummy patterns 327 and the second lower dummy patterns 338 during the folding of the display device 10 can be reduced so that the folding of the display device 10 can be facilitated.

Figure 15:
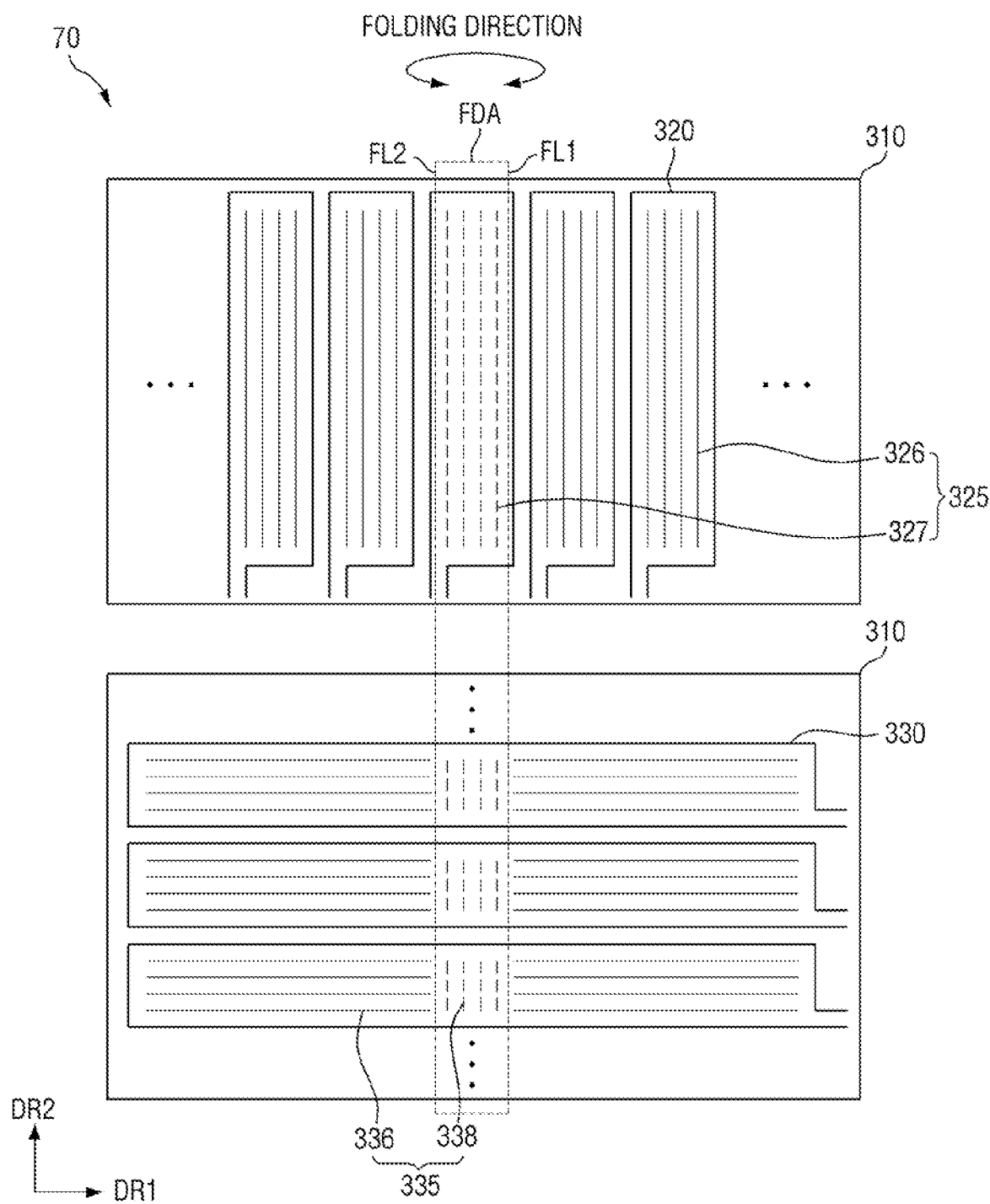

The embodiment of FIG. 15 differs from the embodiment of FIG. 14 in that second upper dummy patterns 327 and second lower dummy pattern 338 are each divided into multiple patterns, that the number of second upper dummy patterns 327 is greater than the number of first upper dummy patterns 326, and that the number of second lower dummy patterns 338 is greater than the number of first lower dummy patterns 336.

Referring to FIG. 15, the second upper dummy patterns 327 may extend in parallel to first and second folding lines FL1 and FL2 and may each consist of a plurality of split patterns. In exemplary embodiments of the present invention, the second upper dummy patterns 327 may be formed as dotted lines or dashes. The second lower dummy patterns 338 may extend in parallel to the first and second folding lines FL1 and FL2 and may each consist of a plurality of split patterns. In exemplary embodiments of the present invention, the second lower dummy patterns 338 may be formed as dotted lines or dashes.

Since the second upper dummy patterns 327 and the second lower dummy patterns 338 are formed as arrays of multiple split patterns, the stress applied to the second upper dummy patterns 327 and the second lower dummy patterns 338 during the folding of the display device 10 can be distributed so that the folding of the display device 10 can be facilitated.

Figure 16:
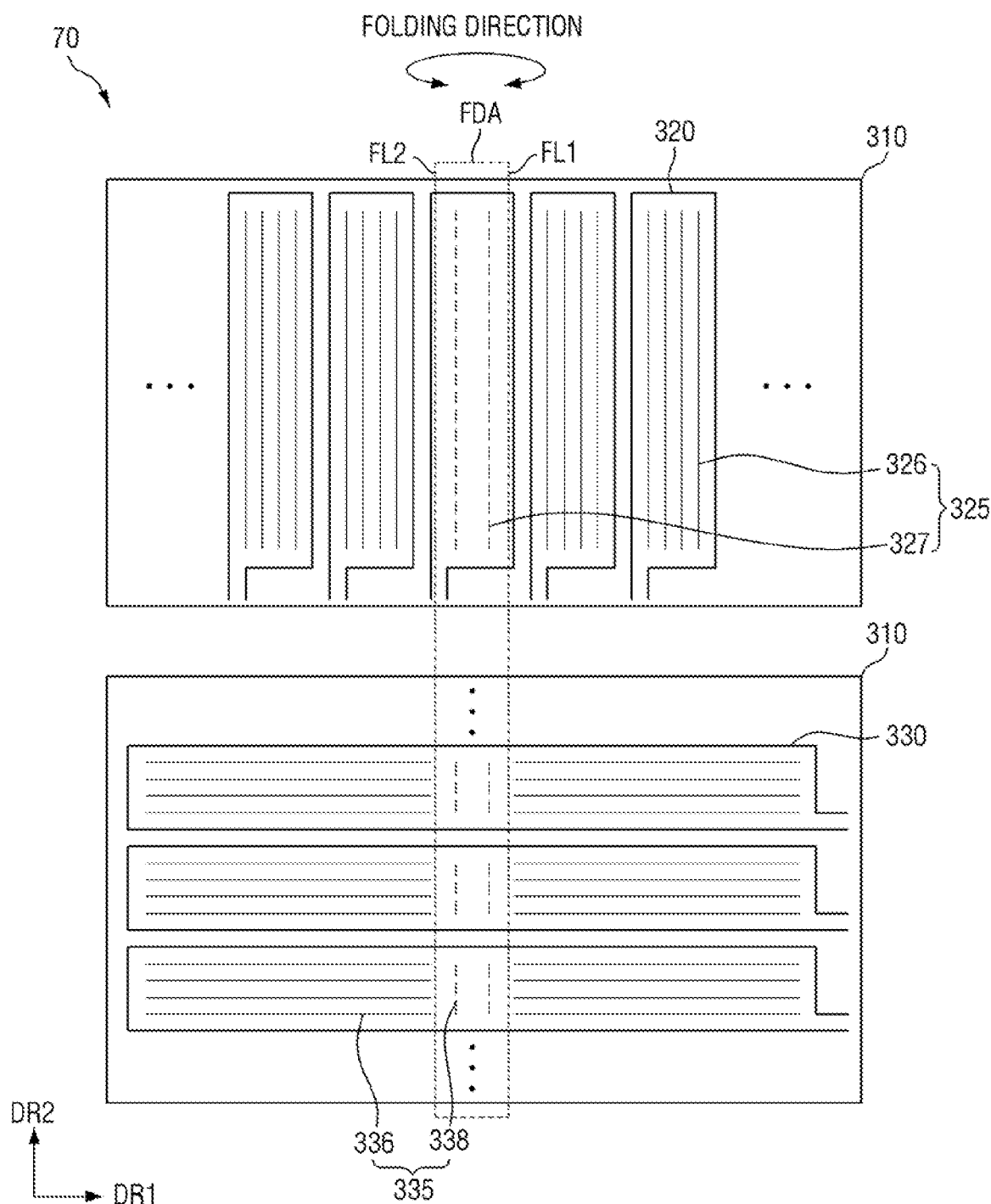

The embodiment of FIG. 16 differs from the embodiment of FIG. 15 in that the number of lines that form each of a plurality of second upper dummy patterns 327 is fewer than the number of lines that form each of a plurality of first upper dummy patterns 326, and that the number of lines that form each of a plurality of second lower dummy patterns 338 is fewer than the number of lines that form each of a plurality of first lower dummy patterns 336.

Referring to FIG. 16, the number of lines that form each of the second upper dummy patterns 327 is fewer than the number of lines that form each of the first upper dummy patterns 326. Here, the second upper dummy patterns 327 may be formed as dotted lines, in which case, the lines that form each of the second upper dummy patterns 327 may refer to the segments of each of the dotted lines. Since the number of lines that form each of the second upper dummy patterns 327 is fewer than the number of lines that form each of the first upper dummy patterns 326, the number of second upper dummy patterns 327 arranged in a perpendicular direction with respect to first and second folding lines FL1 and FL2 decreases, and thus, the repelling force of the second upper dummy patterns 327 during the folding of the display device 10 can be reduced.

Similarly, since the number of lines that form each of the second lower dummy patterns 338 is fewer than the number of lines that form each of the first lower dummy patterns 336, the number of second lower dummy patterns 338 arranged in the perpendicular direction with respect to the first and second folding lines FL1 and FL2 decreases, and thus, the repelling force of the second lower dummy patterns 338 during the folding of the display device 10 can be reduced.

Figure 17:
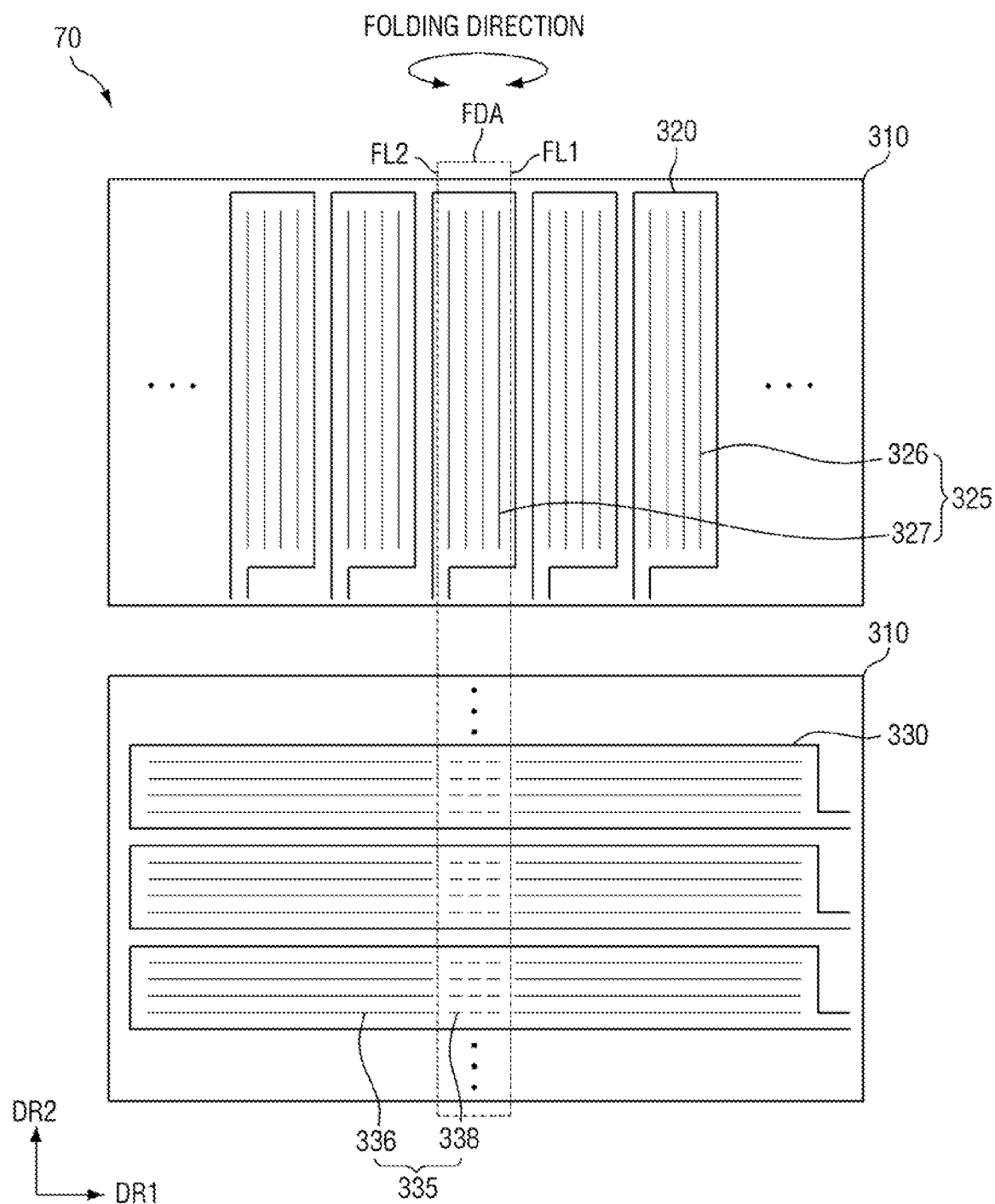

The embodiment of FIG. 17 differs from the embodiment of FIG. 14 in that the direction in which second lower dummy patterns 338 extend perpendicularly intersects first and second folding lines FL1 and FL2, and that the second lower dummy patterns 338 are formed as arrays of multiple split patterns.

Referring to FIG. 17, the direction in which the second lower dummy patterns 338 extend may be parallel to the direction in which first lower dummy patterns 336 extend and may perpendicularly intersect the first and second folding lines FL1 and FL2. For example, the second lower dummy patterns 338 may extend in the first direction DR1. However, since the second lower dummy patterns 338 are formed as arrays of multiple split patterns, the repelling force of the second lower dummy patterns 338 during the folding of the display device 10 can be distributed so that the folding of the display device 10 can be facilitated.

Figure 18:
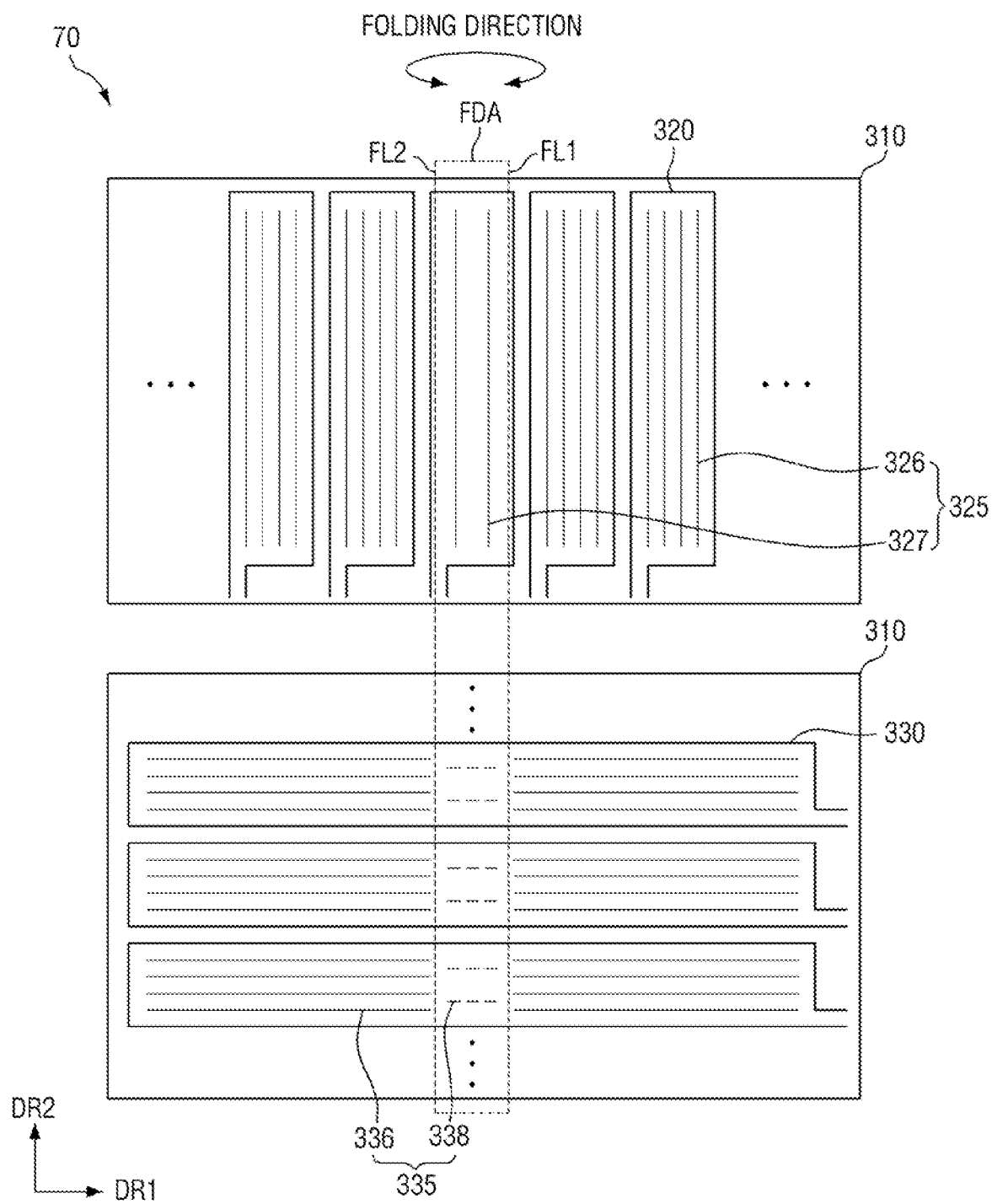

The embodiment of FIG. 18 differs from the embodiment of FIG. 12 in that second lower dummy patterns 338 are formed as arrays of split patterns.

Referring to FIG. 18, since the second lower dummy patterns 338 are formed as arrays of split patterns, the repelling force of the second lower dummy patterns 338 during the folding of the display device 10 can be distributed so that the folding of the display device 10 can be facilitated.

Figure 19:
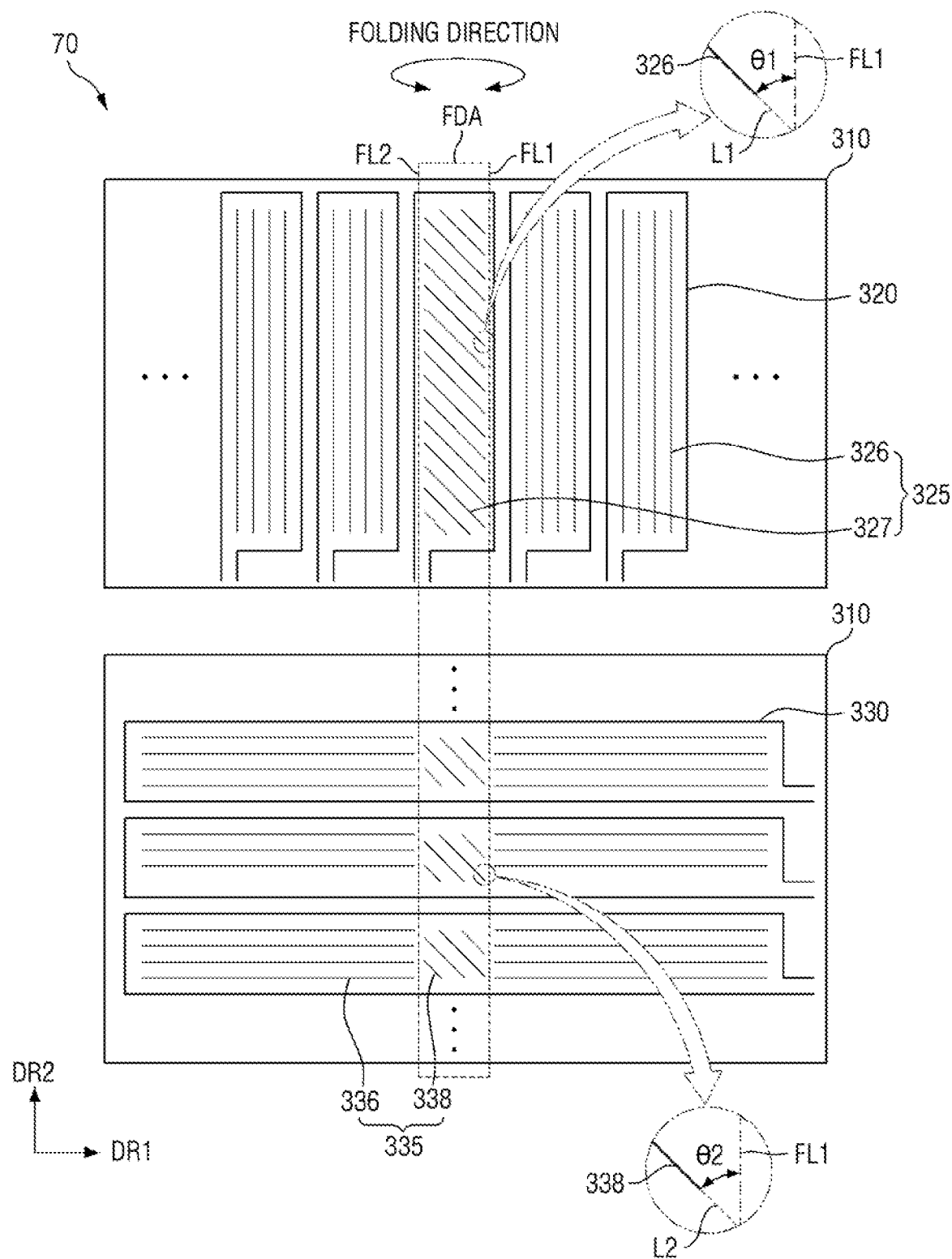

The embodiment of FIG. 19 differs from the embodiment of FIG. 14 in that the direction in which second upper dummy patterns 327 extend and the direction in which second lower dummy patterns 338 extend may intersect a first folding line FL1. In addition, the direction in which second upper dummy patterns 327 extend and the direction in which second lower dummy patterns 338 extend may intersect a second folding line FL2.

Referring to FIG. 19, the direction in which the second upper dummy patterns 327 extend may intersect first upper dummy patterns 326 and the first folding line FL1. For example, an extension line L1 from one of the second upper dummy patterns 327 may intersect the first folding line FL1. The extension line L1 may form a predetermined angle with the first folding line FL1. The extension line L1 may form a first positive angle θ1 with the first folding line FL1, and the first positive angle θ1 may be less than 90 degrees. Alternatively, the first positive angle θ1 may be 20 to 70 degrees. Yet alternatively, the first positive angle θ1 may be 40 to 60 degrees.

The direction in which second lower dummy patterns 338 extend may intersect first lower dummy patterns 336 and the first folding line FL1. For example, an extension line L2 from one of the second lower dummy patterns 338 may intersect the first folding line FL1. The extension line L2 may form a predetermined angle with the first folding line FL1. The extension line L2 may form a second positive angle θ2 with the first folding line FL1, and the second positive angle θ2 may be less than 90 degrees. Alternatively, the second positive angle θ2 may be 20 to 70 degrees. Yet alternatively, the second positive angle θ2 may be 40 to 60 degrees.

The first positive angel θ1 may be the same as the second positive angle θ2. Alternatively, the first positive angel θ1 may be different from the second positive angle θ2.

Since the direction in which the second upper dummy patterns 327 extend and the direction in which the second lower dummy patterns 338 extend intersect the first folding line FL1, the repelling forces of the second upper dummy patterns 327 and the second lower dummy patterns 338 during the folding of the display device 10 can be reduced so that the folding of the display device 10 can be facilitated.

Figure 20:
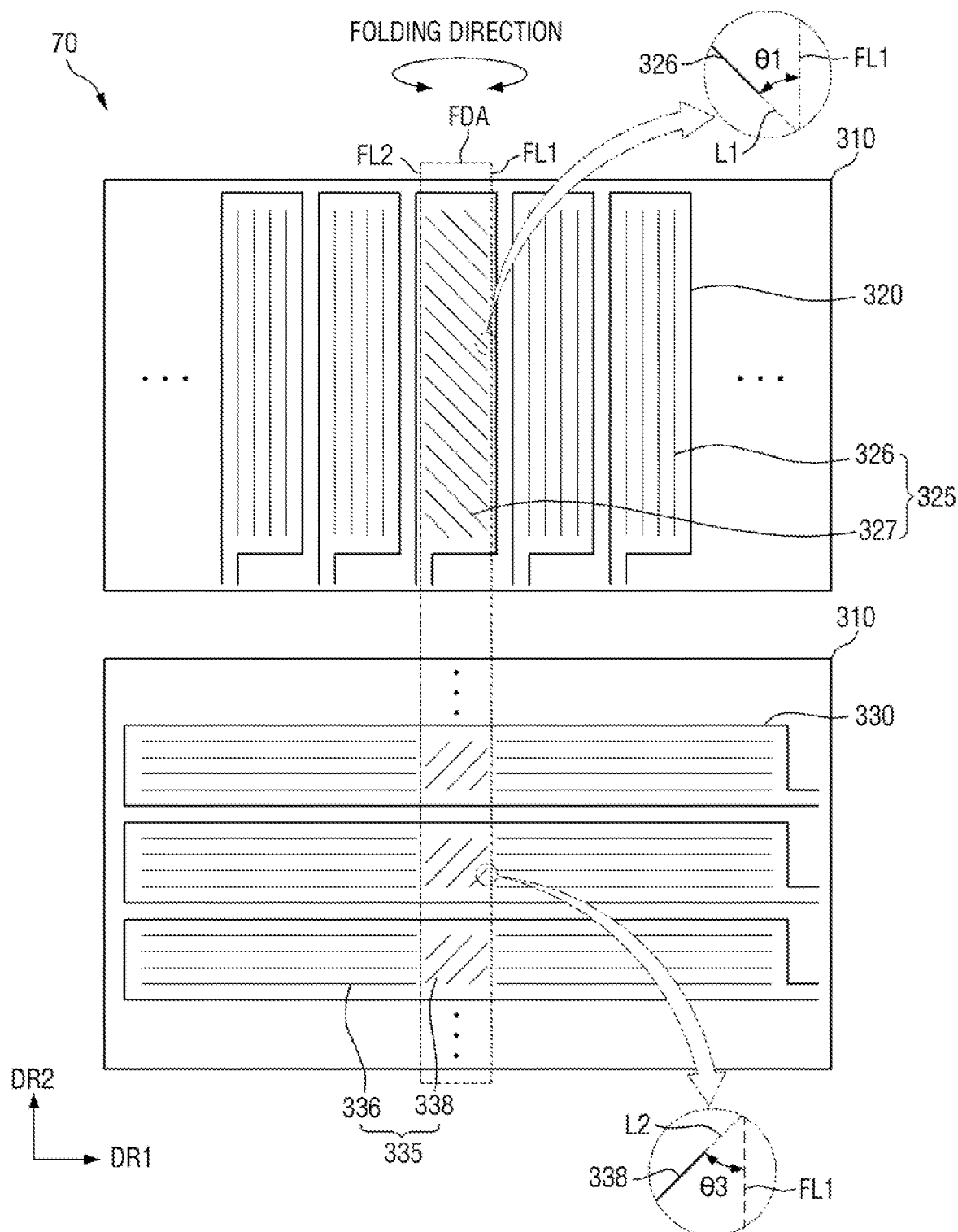

The embodiment of FIG. 20 differs from the embodiment of FIG. 19 in that an extension line L2 of one of second lower dummy patterns 338 and a first folding line FL1 form a first negative angle θ3 with each other.

Referring to FIG. 20, the extension line L2 may form the first negative angle θ3 with the first folding line FL1. The first negative angle θ3 may be less than 90 degrees. Alternatively, the first negative angle θ3 may be 20 to 70 degrees. Yet alternatively, the first negative angle θ3 may be 40 to 60 degrees. A first positive angle θ1 that an extension line L1 of one of second upper dummy patterns 326 and the first folding line FL1 form with each other may differ from the first negative angle θ3.

Since the second lower dummy patterns 338 are formed so that the extension line L2 and the first folding line FL1 form the first negative angle θ3 with each other, the repelling force of the second lower dummy patterns 338 during the folding of the display device 10 can be reduced so that the folding of the display device 10 can be facilitated.

Figure 21:
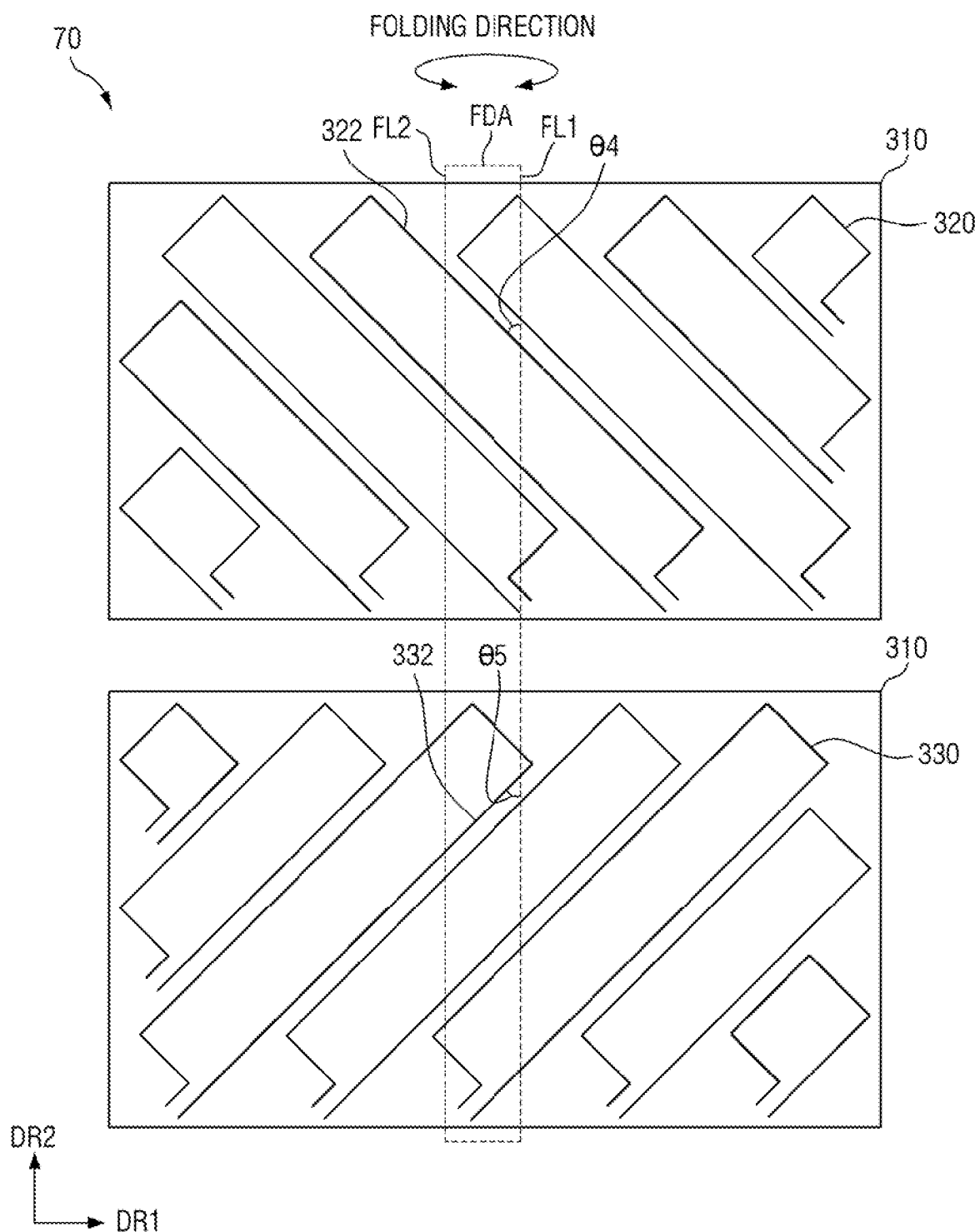
FIG. 21 is a plan view illustrating first circuit patterns and second circuit patterns of a digitizer according to another exemplary embodiment of the present invention.

FIG. 21 is a plan view illustrating first circuit patterns and second circuit patterns of a digitizer according to another exemplary embodiment of the present invention. FIGS. 22 through 27 are plan views illustrating first circuit patterns and second circuit patterns of digitizers according to exemplary embodiments of the present invention. FIGS. 22 through 27 illustrate layout views of first circuit patterns and first dummy patterns on the top surface of each digitizer and layout views of second circuit patterns and second dummy patterns on the bottom surface of each digitizer together.

Referring to FIGS. 21 through 27, a digitizer 70 may include first circuit patterns 320 and second circuit patterns 330. The embodiments of FIGS. 21 through 27 are almost the same as the embodiment of FIG. 10 except that the lengthwise direction of the first circuit patterns 320 and the lengthwise direction of the second circuit patterns 330 intersect a first folding line FL1, and thus will hereinafter be described, focusing mainly on the differences with the embodiment of FIG. 10.

Referring to FIG. 21, the first circuit patterns 320, which extend in a predetermined direction, may be disposed on one surface (or the top surface) of a base layer 310, and the second circuit patterns 330, which extend in another predetermined direction, may be disposed on the other surface (or the bottom surface) of the base layer 310. For example, the first circuit patterns 320 may extend in a first diagonal direction and the second circuit patterns 330 may extend in a second diagonal direction.

The first circuit patterns 320 and the second circuit patterns 330 may intersect each other in a plan view. For example, the first circuit patterns 320 and the second circuit patterns 330 may intersect each other to form a lattice structure. In other words, when the first circuit patterns 320 and the second circuit patterns 330 overlap, they form a lattice structure.

The first circuit patterns 320 may extend in a predetermined direction, and the predetermined direction may be the lengthwise direction of the first circuit patterns 320. The lengthwise direction of the first circuit patterns 320 may be the direction in which long sides 322 of each of the first circuit patterns 320 extend. The lengthwise direction of the first circuit patterns 320 may intersect the first folding line FL1.

For example, the long sides 322 of each of the first circuit patterns 320 may intersect the first folding line FL1. Here, the long sides 322 of each of the first circuit patterns 320 may form a predetermined angle with the first folding line FL1. The long sides 322 of each of the first circuit patterns 320 may form a third positive angle θ4 with the first folding line FL1, and the third positive angle θ4 may be less than 90 degrees. Alternatively, the third positive angle θ4 may be 20 to 70 degrees. Yet alternatively, the third positive angle θ4 may be 40 to 60 degrees.

The second circuit patterns 330 may extend in a predetermined direction, and the predetermined direction may be the lengthwise direction of the first circuit patterns 320. The lengthwise direction of the second circuit patterns 330 may be the direction in which long sides 332 of each of the second circuit patterns 330 extend. The lengthwise direction of the second circuit patterns 330 may intersect the first folding line FL1.

For example, the long sides 332 of each of the second circuit patterns 330 may intersect the first folding line FL1. Here, the long sides 332 of each of the second circuit patterns 330 may form a predetermined angle with the first folding line FL1. The long sides 332 of each of the second circuit patterns 330 may form a second negative angle θ5 with the first folding line FL1, and the second negative angle θ5 may be less than 90 degrees. Alternatively, the second negative angle θ5 may be 20 to 70 degrees. Yet alternatively, the second negative angle θ5 may be 40 to 60 degrees.

Since the direction in which the second circuit patterns 330 extend intersects the first folding line FL1, the repelling force of the second circuit patterns 330 during the folding of the display device 10 can be reduced so that the folding of the display device 10 can be facilitated. In addition, since the direction in which the first circuit patterns 320 extend intersects not only the first folding line FL1, but also the second circuit patterns 330, the first circuit patterns 320 and the second circuit patterns 330 can detect a touch by a stylus.

Figure 22:
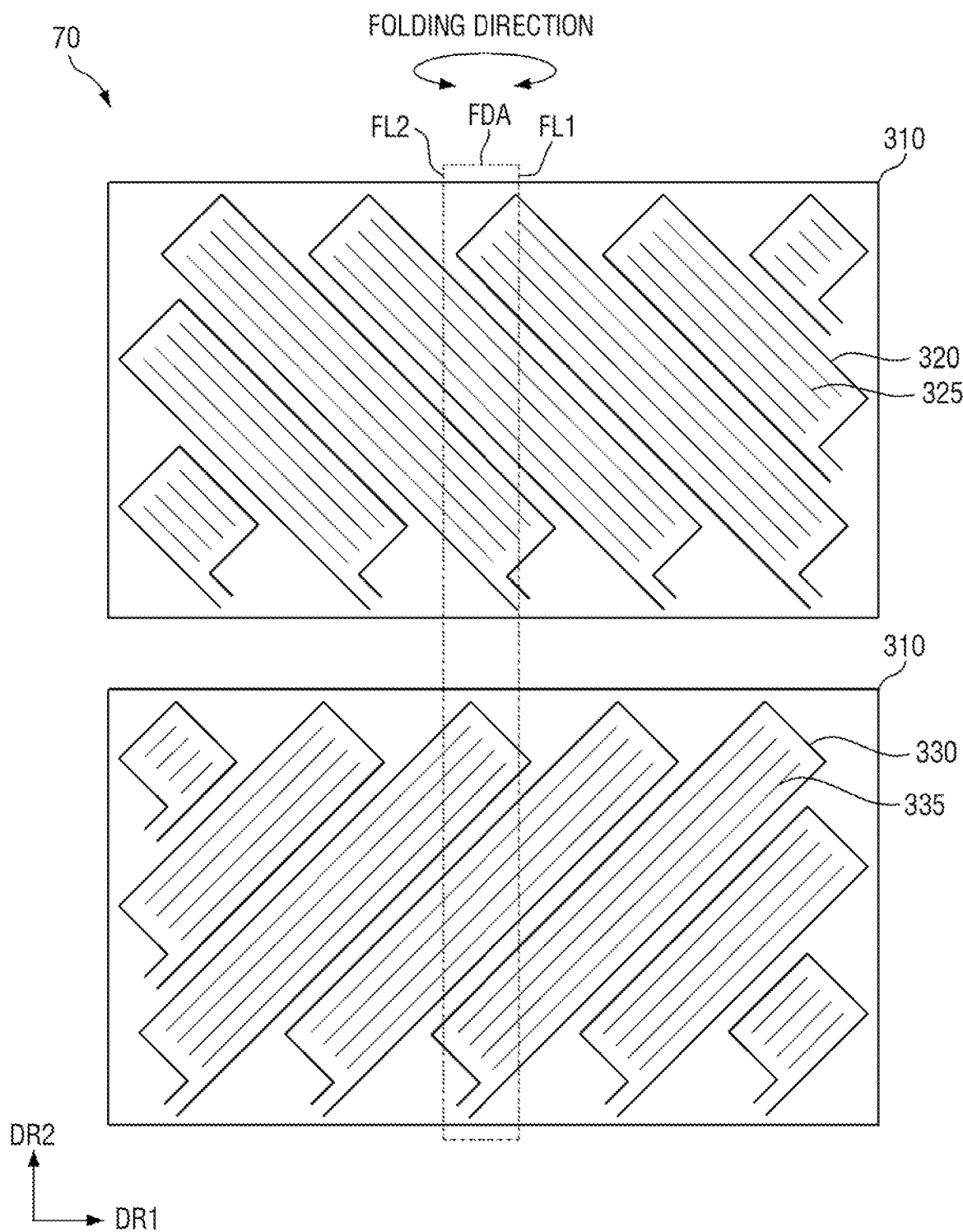
FIGS. 22, 23, 24, 25, 26 and 27 are plan views illustrating first circuit patterns and second circuit patterns of digitizers according to other exemplary embodiments of the present invention.

The embodiment of FIG. 22 differs from the embodiment of FIG. 21 in that first circuit patterns 320 include, at least in-part, first dummy patterns 325, and that second circuit patterns 330 include, at least in-part, second dummy patterns 335.

Referring to FIG. 22, the first dummy patterns 325 may be arranged in parallel to the lengthwise direction of the first circuit patterns 320. The direction in which the first dummy patterns 325 extend may be parallel to a first or second folding line FL1 or FL2. The second dummy patterns 335 may be arranged in parallel to the lengthwise direction of the second circuit patterns 330. The direction in which the second dummy patterns 335 extend may intersect the first or second folding line FL1 or FL2. For example, the first dummy patterns 325 and the second dummy patterns 335 may both intersect the first folding line FL1. Since the first dummy patterns 325 and the second dummy patterns 335 both intersect the first folding line FL1, the repelling forces of the first dummy patterns 325 and the second dummy patterns 335 during the folding of the display device 10 can be reduced so that the folding of the display device 10 can be facilitated.

Figure 23:
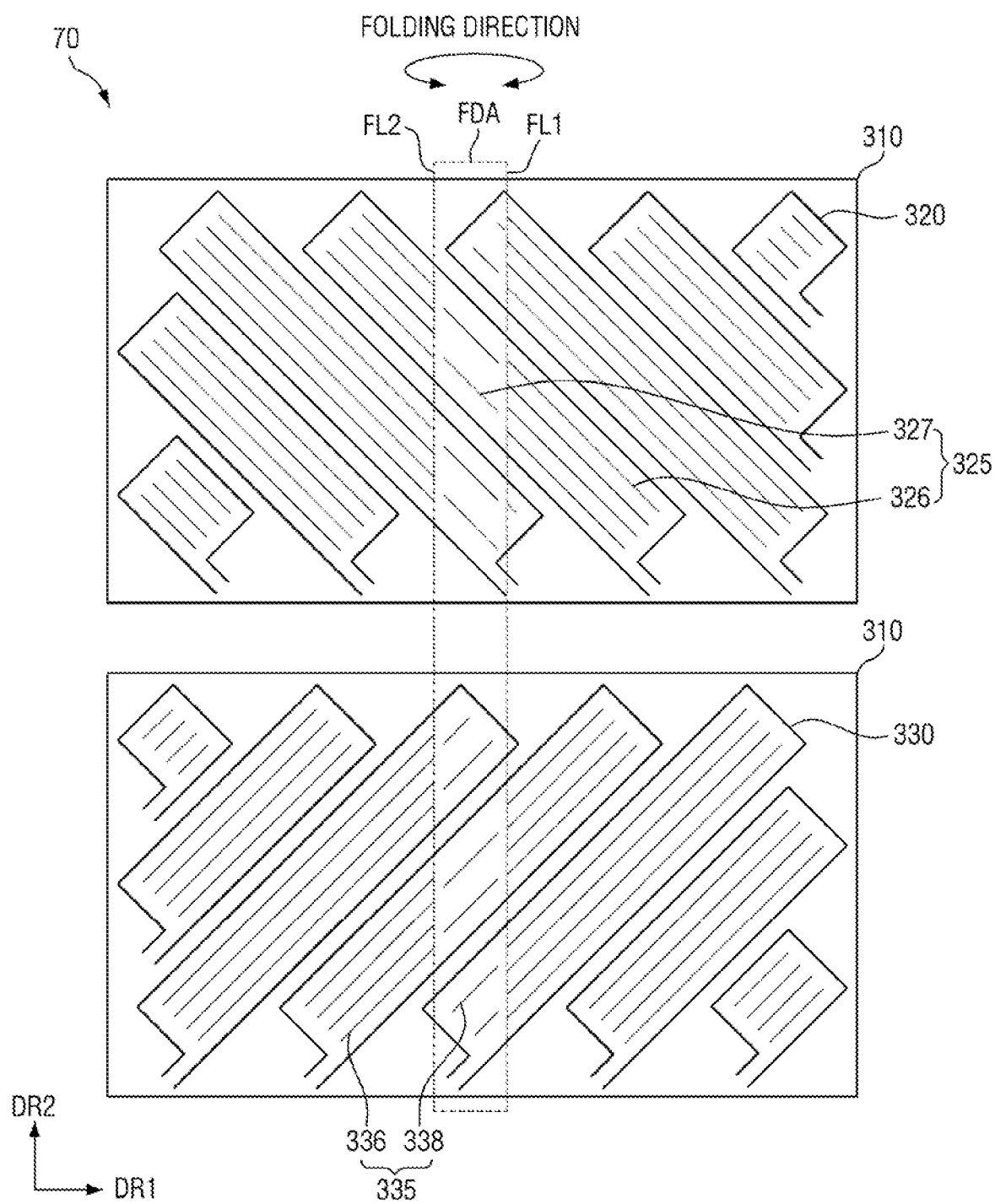

The embodiment of FIG. 23 differs from the embodiment of FIG. 22 in that the number of first dummy patterns 325 that overlap with a folding area FDA is smaller than the number of first dummy patterns 325 that do not overlap with the folding area FDA, and that the number of second dummy patterns 335 that overlap with the folding area FDA is smaller than the number of second dummy patterns 335 that do not overlap with the folding area FDA.

Referring to FIG. 23, the first dummy patterns 325 may include first upper dummy patterns 326, which are disposed in areas other than the folding area FDA, and second upper dummy patterns 327, which are disposed in the folding area FDA. The first upper dummy patterns 326 may not overlap with the folding area FDA, and the second upper dummy patterns 327 may overlap with the folding area FDA.

One or more second upper dummy patterns 327 may overlap the folding area FDA. The number of second upper dummy patterns 327 may be smaller than the number of first upper dummy patterns 326. In a case where a plurality of second upper dummy patterns 327 are provided, the distance between the second upper dummy patterns 327 may be greater than the distance between the first upper dummy patterns 326. As mentioned above, if dummy patterns are disposed in the folding area FDA, the display device 10 may not be able to be easily folded. However, since the number of second upper dummy patterns 327, which overlap with the folding area FDA, is smaller than the number of first upper dummy patterns 326, which do not overlap with the folding area FDA, the folding of the display device 10 may not be impacted by the second upper dummy patterns 327.

The second dummy patterns 335 may include first lower dummy patterns 336, which are disposed in the area other than the folding area FDA, and second lower dummy patterns 338, which are disposed in the folding area FDA. The first lower dummy patterns 336 may not overlap with the folding area FDA, and the second lower dummy patterns 338 may overlap with the folding area FDA.

One or more second lower dummy patterns 338 may be disposed to overlap with the folding area FDA. The number of second lower dummy patterns 338 may be smaller than the number of first lower dummy patterns 336. In a case where a plurality of second lower dummy patterns 338 are provided, the distance between the second lower dummy patterns 338 may be greater than the distance between the first lower dummy patterns 336. Since the number of second lower dummy patterns 338, which overlap with the folding area FDA, is smaller than the number of first lower dummy patterns 336, which do not overlap with the folding area FDA, the folding of the display device 10 may not be impacted by the second lower dummy patterns 338.

Figure 24:
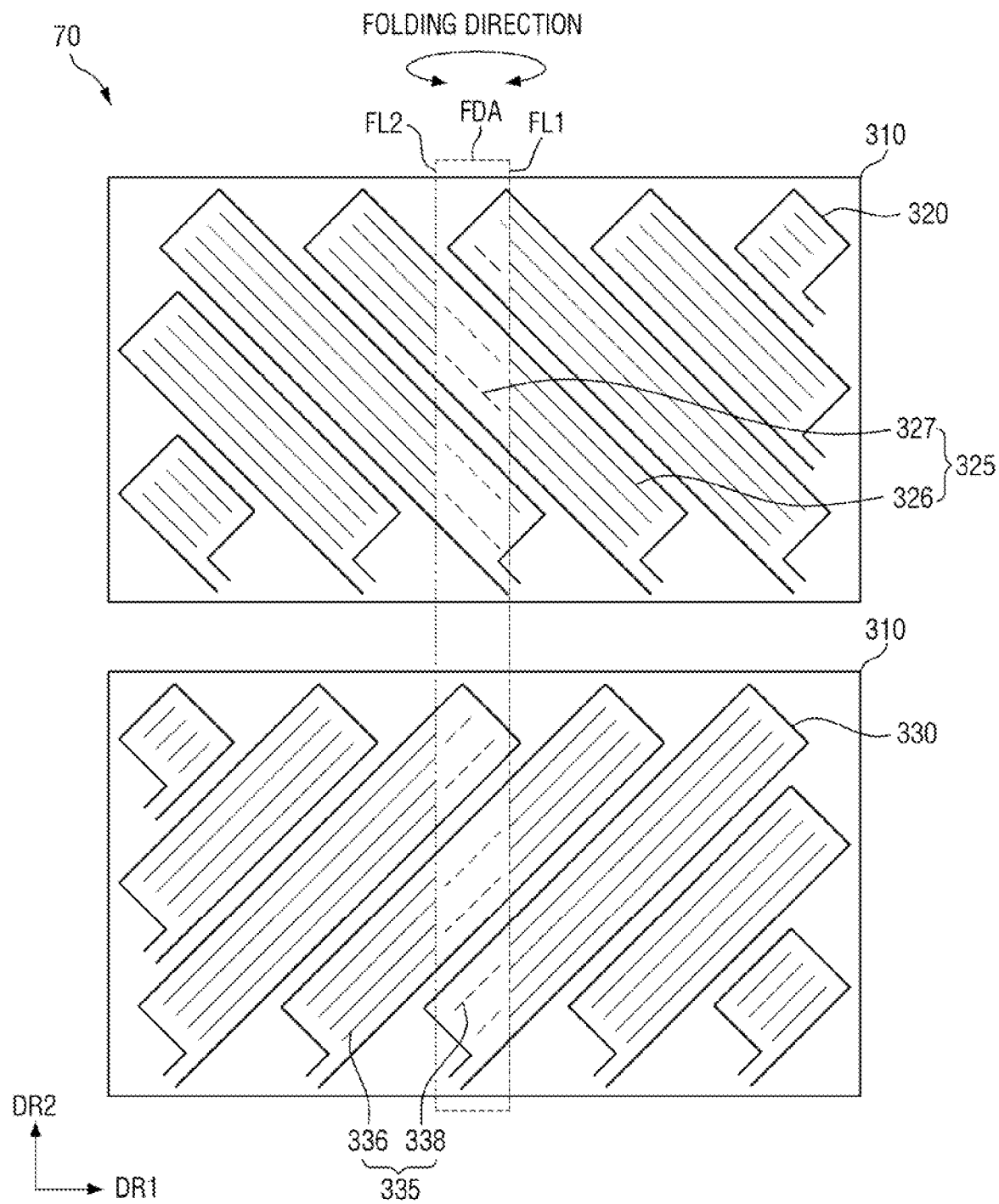

The embodiment of FIG. 24 differs from the embodiment of FIG. 23 in that second upper dummy patterns 327 and second lower dummy pattern 338 are formed as arrays of split patterns.

Referring to FIG. 24, the second upper dummy patterns 327 may extend to intersect first and second folding lines FL1 and FL2 and may each consist of a plurality of split patterns. In exemplary embodiments of the present invention, the second upper dummy patterns 327 may be formed as dotted lines or dashes. The second lower dummy patterns 338 may extend to intersect the first and second folding lines FL1 and FL2 and may each consist of a plurality of split patterns. In exemplary embodiments of the present invention, the second lower dummy patterns 338 may be formed as dotted lines or dashes. The second upper dummy patterns 327 and the second lower dummy patterns 338 may extend in different directions from each other.

Since the second upper dummy patterns 327 and the second lower dummy patterns 338 are formed as arrays of multiple split patterns, the stress applied to the second upper dummy patterns 327 and the second lower dummy patterns 338 during the folding of the display device 10 can be distributed so that the folding of the display device 10 can be facilitated.

Figure 25:
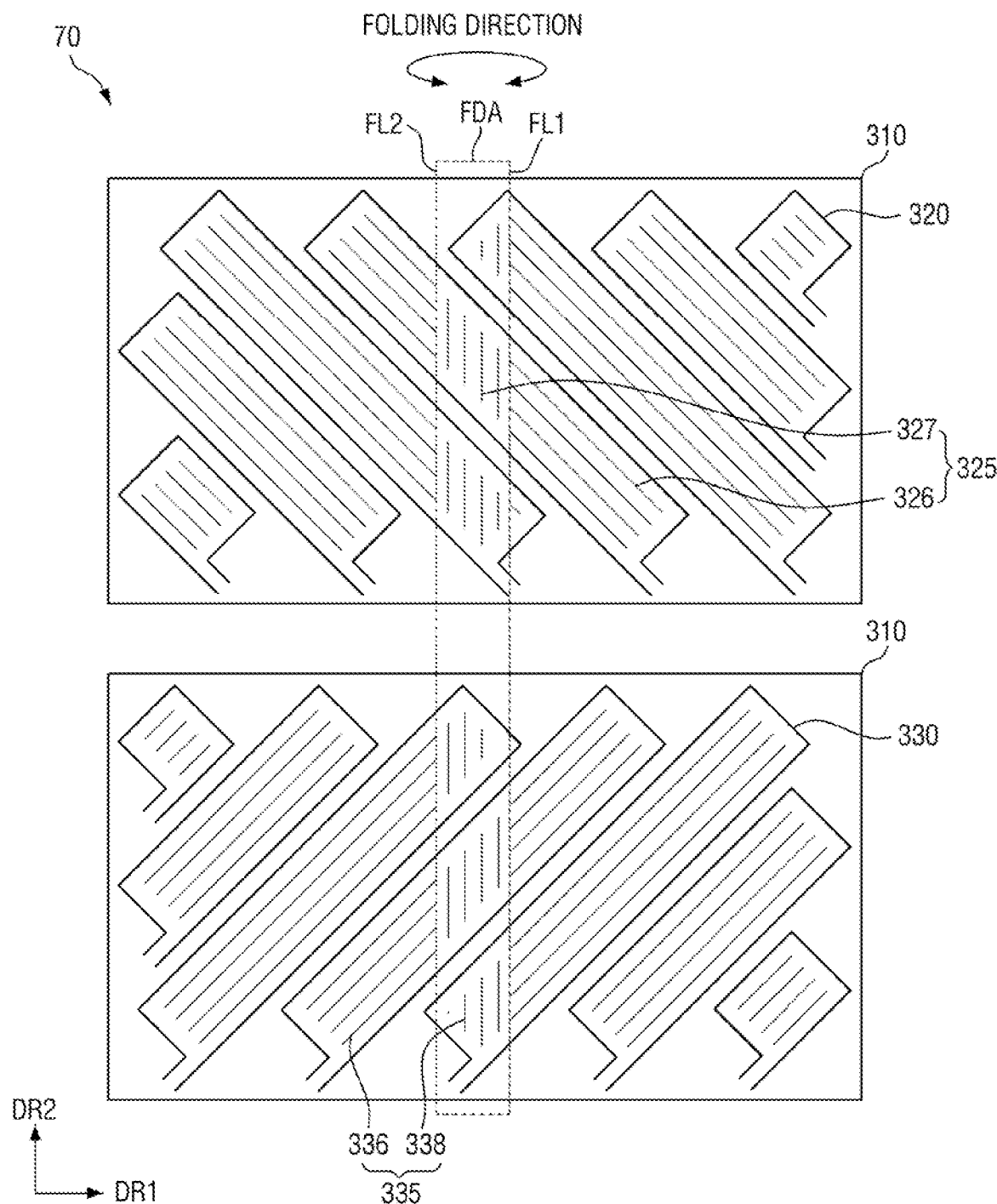

The embodiment of FIG. 25 differs from the embodiment of FIG. 23 in that the direction in which second upper dummy patterns 327 extend is parallel to first and second folding lines FL1 and FL2, and that the direction in which second lower dummy patterns 338 extend is parallel to the first and second folding lines FL1 and FL2. In other words, the second upper dummy patterns 327 and the second lower dummy patterns 338 may extend in the same direction.

Referring to FIG. 25, the direction in which the second upper dummy patterns 327 extend intersects the direction in which first upper dummy patterns 326 extend and may be parallel to the first and second folding lines FL1 and FL2. In addition, the direction in which the second lower dummy patterns 338 extend intersects the direction in which first lower dummy patterns 336 extend and may be parallel to the first and second folding lines FL1 and FL2. The direction in which the second upper dummy patterns 327 extend may be parallel to, and the same as, the direction in which the second lower dummy patterns 338 extend.

Since the direction in which the second upper dummy patterns 327 extend and the direction in which the second lower dummy patterns 338 extend are parallel to the first and second folding lines FL1 and FL2, the repelling forces of the second upper dummy patterns 327 and the second lower dummy patterns 338 during the folding of the display device 10 can be reduced so that the folding of the display device 10 can be facilitated.

Figure 26:
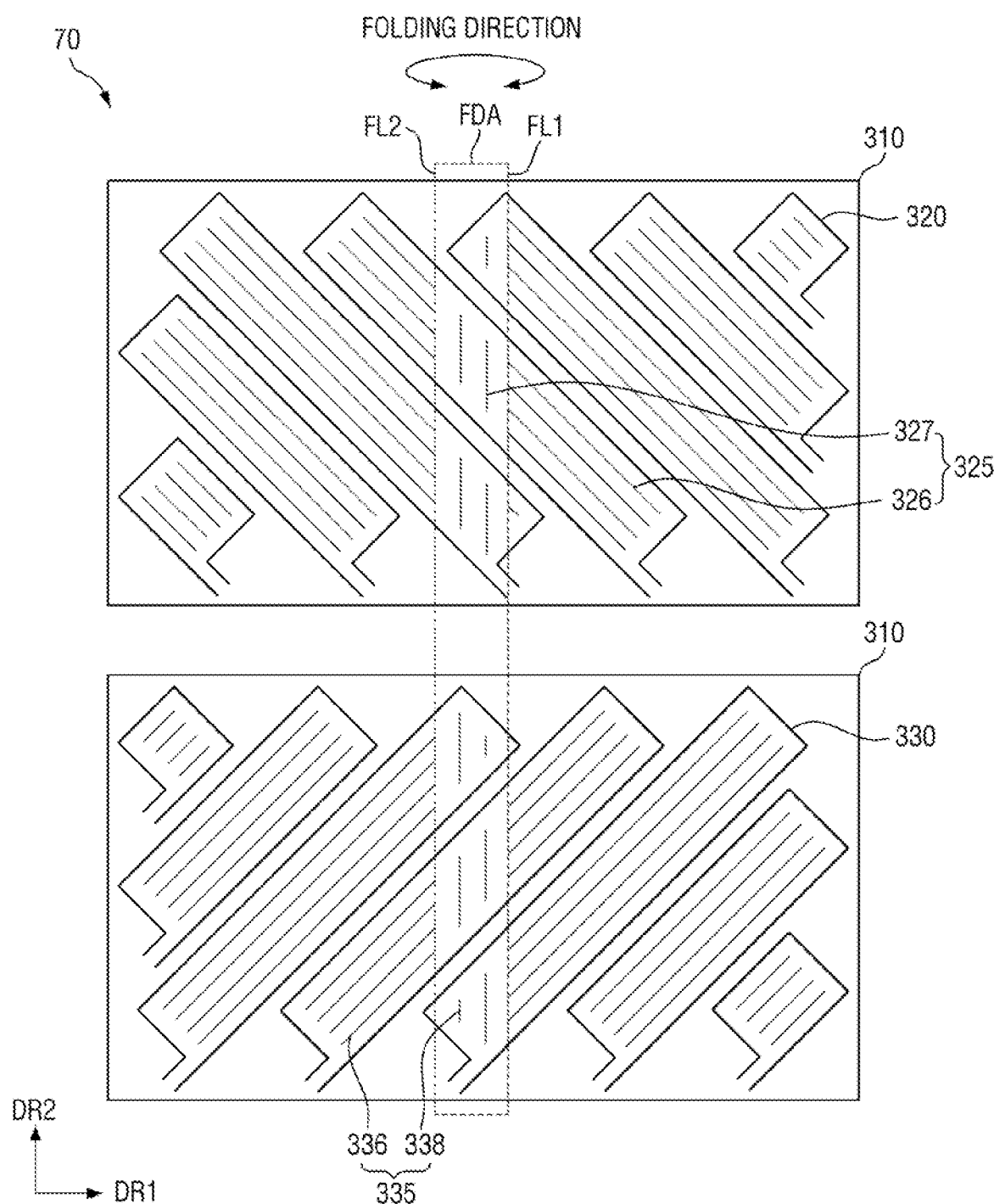

The embodiment of FIG. 26 differs from the embodiment of FIG. 25 in that the number of second upper dummy patterns 327 is smaller than the number of first upper dummy patterns 326, and that the number of second lower dummy patterns 338 is smaller than the number of first lower dummy patterns 336.

Referring to FIG. 26, the number of second upper dummy patterns 327 may be smaller than the number of first upper dummy patterns 326, and thus, the number of second upper dummy patterns 327 arranged in perpendicular direction with respect to first and second folding lines FL1 and FL2 decreases. Thus, the repelling force of the second upper dummy patterns 327 during the folding of the display device 10 can be reduced.

Similarly, the number of second lower dummy patterns 338 may be smaller than the number of first lower dummy patterns 338, and thus, the number of second lower dummy patterns 338 arranged in the perpendicular direction with respect to the first and second folding lines FL1 and FL2 decreases. Thus, the repelling force of the second lower dummy patterns 338 during the folding of the display device 10 can be reduced.

Figure 27:
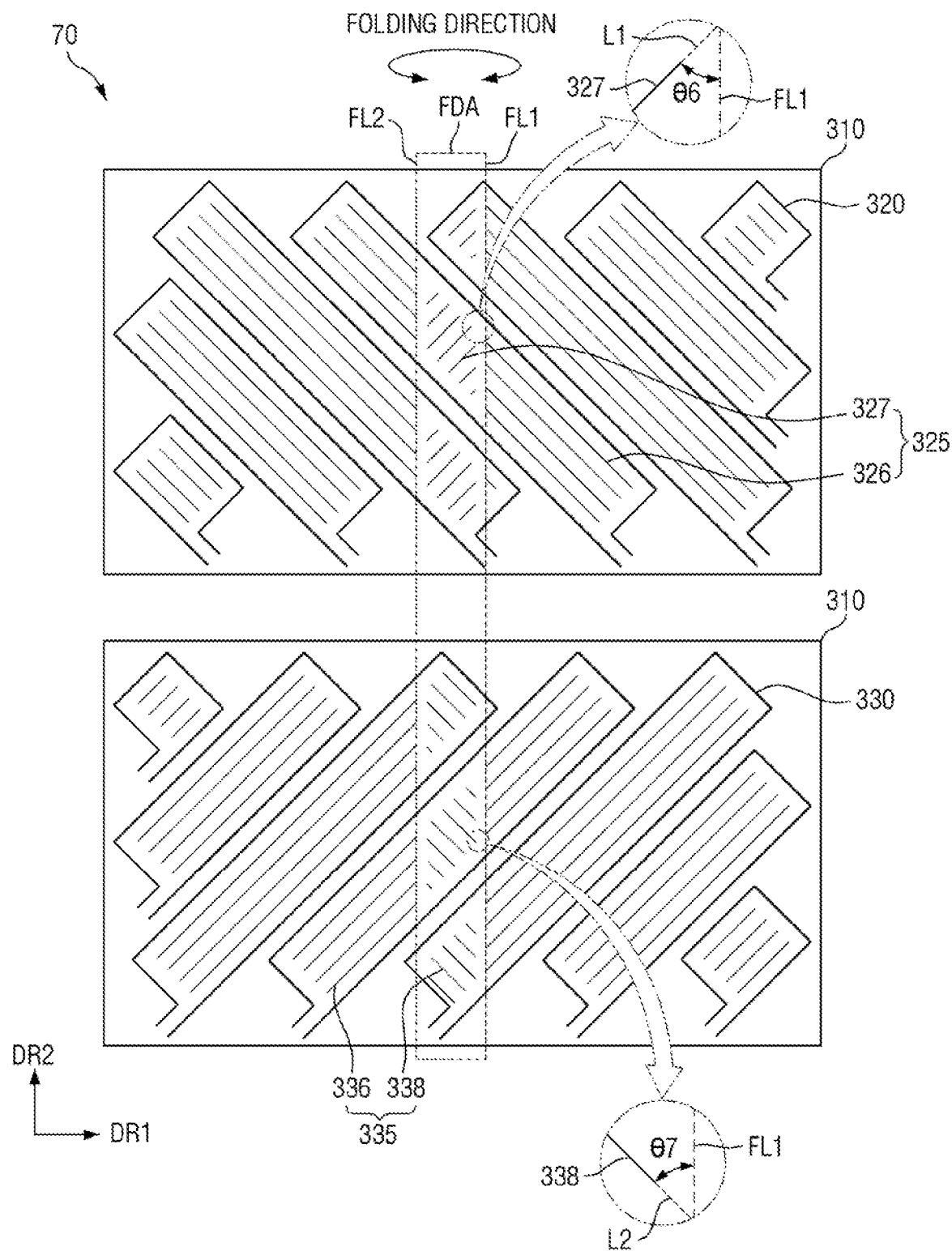

The embodiment of FIG. 27 differs from the embodiment of FIG. 25 in that the direction in which second upper dummy patterns 327 extend intersects first upper dummy patterns 326 and a first folding line FL1, and that the direction in which second lower dummy patterns 338 extend intersects first lower dummy patterns 336 and the first folding line FL1.

Referring to FIG. 27, the direction in which the second upper dummy patterns 327 extend may interest the first upper dummy patterns 326 and the first folding line FL1. For example, an extension line L1 of one of the second upper dummy patterns 327 may intersect the first folding line FL1. Here, the extension line L1 and the first folding line FL1 may form a predetermined angle with each other. The extension line L1 may form a third negative angle $\theta 6$ with the first folding line FL1, and the third negative angle $\theta 6$ may be less than 90 degrees. Alternatively, the third negative angle $\theta 6$ may be 20 to 70 degrees. Yet alternatively, the third negative angle $\theta 6$ may be 40 to 60 degrees.

The direction in which second lower dummy patterns 338 extend may interest first lower dummy patterns 336 and the first folding line FL1. For example, an extension line L2 of one of the second lower dummy patterns 338 may intersect the first folding line FL1. Here, the extension line L2 and the first folding line FL1 may form a predetermined angle with each other. The extension line L2 may form a fourth positive angle $\theta 7$ with the first folding line FL1, and the fourth positive angle $\theta 7$ may be less than 90 degrees. Alternatively, the fourth positive angle $\theta 7$ may be 20 to 70 degrees. Yet alternatively, the fourth positive angle $\theta 7$ may be 40 to 60 degrees.

The third negative angle $\theta 6$ may be the same as the fourth positive angle $\theta 7$. Alternatively, the third negative angle $\theta 6$ may be different from the fourth positive angle $\theta 7$.

Since the direction in which the second upper dummy patterns 327 extend intersects the first upper dummy patterns 326 and the first folding line FL1 and the direction in which the second lower dummy patterns 338 extend intersects the first lower dummy patterns 336 and the first folding line FL1, the repelling forces of the second upper dummy patterns 327 and the second lower dummy patterns 338 during the folding of the display device 10 can be reduced so that the folding of the display device 10 can be facilitated.

Test results obtained from display devices including the digitizers according to the aforementioned embodiments will hereinafter be described. To test the digitizers according to the aforementioned embodiments, 6.7-inch foldable display devices each including OLEDs and a digitizer were fabricated. In the description that follows, embodiment 1 corresponds to a display device including a digitizer having the circuit pattern configuration of FIG. 10, embodiment 2 corresponds to a display device including a digitizer having the circuit pattern configuration of FIG. 12, embodiment 3 corresponds to a display device including a digitizer having the circuit pattern configuration of FIG. 18, embodiment 4 corresponds to a display device including a digitizer having the circuit pattern configuration of FIG. 13, embodiment 5 corresponds to a display device including a digitizer having the circuit pattern configuration of FIG. 16, embodiment 6 corresponds to a display device including a digitizer having the circuit pattern configuration of FIG. 21, embodiment 7 corresponds to a display device including a digitizer having the circuit pattern configuration of FIG. 23, and embodiment 8 corresponds to a display device including a digitizer having the circuit pattern configuration of FIG. 24.

The display devices according to embodiments 1 through 8 were tested for whether the circuit patterns of their digitizers were visible to the naked eye after being folded and unfolded repeatedly, and the results are as shown in Table 1 below. Referring to Table 1, "Folding Count" refers to the number of times each display device was folded and unfolded until the digitizer of each display device stopped operating properly.

TABLE 1

| | Degree of Visibility | Folding Count |
|---|---|---|
| Embodiment 1 | Slightly Visible | 200,000 |
| Embodiment 2 | Very Slightly Invisible | 100,000 |
| Embodiment 3 | Very Slightly Invisible | 150,000 |
| Embodiment 4 | Very Slightly Invisible | 170,000 |
| Embodiment 5 | Very Slightly Invisible | 200,000 |
| Embodiment 6 | Slightly Visible | 200,000 |
| Embodiment 7 | Very Slightly Invisible | 150,000 |
| Embodiment 8 | Very Slightly Invisible | 200,000 |

As shown in Table 1, the display devices according to embodiments 1 through 8 have "slightly visible" or "very slightly invisible" digitizer circuit patterns and a folding count of at least 100,000. For example, the display devices according to embodiments 5 and 8 have "very slightly invisible" digitizer circuit patterns and a folding count of 200,000 or greater. As can be gleaned from Table 1, digitizers with fewer dummy patterns (e.g., in the form of split patterns) in their folding areas provide excellent performance.

Exemplary embodiments of the present invention provide a display device including a digitizer with increased flexibility.

Exemplary embodiments of the present invention also provide a display device including a digitizer that has reduced wiring visibility.

Although exemplary embodiments of the present invention have been described with reference to the accompanying drawings, those skilled in the art would understand that various modifications and alterations may be made thereto without departing from the scope of the present invention as set forth in the claims.

What is claimed is:

1. A display device, comprising:
   a display panel; and
   a digitizer overlapped by the display panel,
   wherein the digitizer includes a base layer, a folding area, first circuit patterns disposed on a first surface of the base layer and extending in a first direction, a plurality of first dummy patterns disposed in regions defined by the first circuit patterns, second circuit patterns disposed on a second surface of the base layer and extending in a second direction that intersects the first direction, and a plurality of second dummy patterns disposed in regions defined by the second circuit patterns,
   the second dummy patterns include a plurality of first lower dummy patterns, which do not overlap the folding area, and a plurality of second lower dummy patterns, which overlap the folding area, and
   an area occupied by the second lower dummy patterns is different from an area occupied by the first lower dummy patterns.

2. The display device of claim 1, wherein the area occupied by the second lower dummy patterns is smaller than the area occupied by the first lower dummy patterns.

3. The display device of claim 1, wherein the number of second lower dummy patterns is greater than the number of first low dummy patterns.

4. The display device of claim 3, wherein at least one of the second lower dummy patterns is divided into multiple parts.

5. The display device of claim 2, wherein the number of second lower dummy patterns is smaller than the number of first lower dummy patterns.

6. The display device of claim 5, wherein at least one of the second lower dummy patterns is unbroken.

7. The display device of claim 1, wherein
   the first dummy patterns include a plurality of first upper dummy patterns, which do not overlap the folding area, and a plurality of second upper dummy patterns, which overlap the folding area, and
   an area occupied by the second upper dummy patterns is different from an area occupied by the first upper dummy patterns.

8. The display device of claim 7, wherein the number of second upper dummy patterns is greater than the number of first upper dummy patterns.

9. The display device of claim 8, wherein at least one of the second upper dummy patterns is divided into multiple parts.

10. The display device of claim 7, wherein the number of second upper dummy patterns is smaller than the number of first upper dummy patterns.

11. The display device of claim 10, wherein at least one of the second upper dummy patterns is unbroken.

12. A display device, comprising:
    a display panel; and
    a digitizer overlapped by the display panel, wherein the digitizer includes a base layer, a folding area, first circuit patterns disposed on a first surface of the base layer and extending in a first direction, a plurality of first dummy patterns disposed in regions within the first circuit patterns, second circuit patterns disposed on a second surface of the base layer and extending in a second direction that intersects the first direction, and a plurality of second dummy patterns disposed in regions within the second circuit patterns, the first dummy patterns include a plurality of first upper dummy patterns, which do not overlap the folding area, and a plurality of second upper dummy patterns, which overlap the folding area, and a direction in which the second upper dummy patterns extend intersects a direction in which the first upper dummy patterns extend.

13. The display device of claim 12, wherein the folding area includes a folding line, which is a long side of the folding area.

14. The display device of claim 13, wherein
the direction in which the second upper dummy patterns extend intersects the folding line, and
the direction in which the first upper dummy patterns extend is parallel to the folding line.

15. The display device of claim 13, wherein
the direction in which the second upper dummy patterns extend is parallel to the folding line, and
the direction in which the first upper dummy patterns extend intersects the folding line.

16. The display device of claim 13, wherein the second dummy patterns include a plurality of first lower dummy patterns, which do not overlap the folding area, and a plurality of second lower dummy patterns, which overlap the folding area.

17. The display device of claim 16, wherein a direction in which the second lower dummy patterns extend intersects both a direction in which the first lower dummy patterns extend and the folding line.

18. The display device of claim 16, wherein the direction in which the second lower dummy patterns extend intersects a direction in which the first lower dummy patterns extend and is parallel to the folding line.

19. A display device, comprising:
a display panel; and
a digitizer overlapping the display panel,
wherein the digitizer includes a base layer, a folding area, first circuit patterns disposed on a first surface of the base layer and extending in a first direction, a plurality of first dummy patterns disposed in regions formed by the first circuit patterns, second circuit patterns disposed on a second surface of the base layer and extending in a second direction that intersects the first direction, and a plurality of second dummy patterns disposed in regions formed by the second circuit patterns, and
the first dummy patterns and the second dummy patterns do not overlap the folding area.

20. The display device of claim 19, wherein die second dummy patterns are disposed adjacent to each other with the folding area interposed therebetween.

21. A display device, comprising:
a display panel; and
a digitizer overlapped by the display panel,
wherein the digitizer includes a base layer, a folding area, a plurality of first circuit patterns on a first side of the base layer and a plurality of second circuit patterns on a second side of the base layer,
at least one of the first circuit patterns includes a plurality of first dummy patterns overlapping the base layer and not located in the folding area, and at least one of the second circuit patterns includes a plurality of second dummy patterns overlapping the base layer and not located in the folding area.

22. The display device of claim 21, wherein at least one of the first dummy patterns overlaps at least one of the second dummy patterns.

23. The display device of claim 22, wherein the at least one first circuit pattern extends in a first direction and the at least one second circuit pattern extends in a second direction crossing the first direction.

24. The display device of claim 21, further comprising an adhesive layer overlapping the at least one first circuit pattern and contacting the first side of the base layer.

25. The display device of claim 24, wherein a thickness of the adhesive layer in the folding area is less than a thickness of the adhesive layer overlapping the at least one first circuit pattern.

* * * * *